United States Patent [19]

Sato et al.

[11] Patent Number: 4,894,706

[45] Date of Patent: Jan. 16, 1990

[54] THREE-DIMENSIONAL PACKAGING OF SEMICONDUCTOR DEVICE CHIPS

[75] Inventors: Yoshiyuki Sato; Kazuhide Kiuchi, both of Atsugi; Junji Watanabe; Kunio Koyabu, both of Tokyo; Masanobu Oohata, Atsugi; Katsuhiko Aoki, Tokyo, all of Japan

[73] Assignee: Nippon Telegraph and Telephone Corporation, Tolyo, Japan

[21] Appl. No.: 919,001

[22] PCT Filed: Feb. 14, 1986

[86] PCT No.: PCT/JP86/00065

§ 371 Date: Oct. 9, 1986

§ 102(e) Date: Oct. 9, 1986

[30] Foreign Application Priority Data

Feb. 14, 1985 [JP] Japan ................................. 60-25180
Nov. 12, 1985 [JP] Japan ................................ 60-252016
Jan. 25, 1986 [JP] Japan ................................. 61-12989

[51] Int. Cl.[4] ............................................. H01L 23/28
[52] U.S. Cl. ........................................ 357/72; 357/75; 361/415
[58] Field of Search ........................... 357/72, 74, 75; 361/415, 399, 347

[56] References Cited

U.S. PATENT DOCUMENTS 3,244,843  4/1966  Ross ................................. 200/144 B
4,117,288  9/1978  Gorman et al. ................. 200/144 B

FOREIGN PATENT DOCUMENTS 38-2681   3/1963   Japan .
43-29509  12/1968  Japan .
49-639967 6/1974   Japan .
49-117343 11/1974  Japan .
52-186660 2/1977   Japan .
52-52650  4/1977   Japan .
52-100171 8/1977   Japan .
55-145394 11/1980  Japan .
56-9778   1/1981   Japan .
56-137458 10/1981  Japan .
59-405539 3/1984   Japan .
59-72156  4/1984   Japan .
59-140658 4/1984   Japan .

OTHER PUBLICATIONS

IBM Technical Disclosure Bulletin, vol. 17, No. 10, Mar. 1975, pp. 3084–3086, K. R. Grebe et al.

Primary Examiner—Robert S. Macon
Attorney, Agent, or Firm—Spencer & Frank

[57] ABSTRACT

A chip carrying member (1) such as a film carrier carrying a chip (10) and elastic spacers (2, 3) are stacked to form an elementary unit with adjusting its thickness. By using an aligning aperture (12) of a thin sheet (1), a plurality of the elementary units are stacked to form a laminated structure. From a side surface of the laminated structure, leads (13) are extended to be connected to a wiring board (241), or after the leads (13) are buried in an insulator (8), the leads (13) and insulator (8) are abraded to form a coplanar surface and then a wiring layer (82) for interconnecting is formed on the abraded surface. A usual chip can be mounted on the chip carrying member (1) without any work with a high accuracy in alignment of the lamination and furthermore with a high accuracy in a lamination pitch of the chip carrying member (1), so that the leads (13) of the chip (10) can be wired precisely and finely. A low cost and high density three-dimensional packaging structure can be realized.

33 Claims, 17 Drawing Sheets

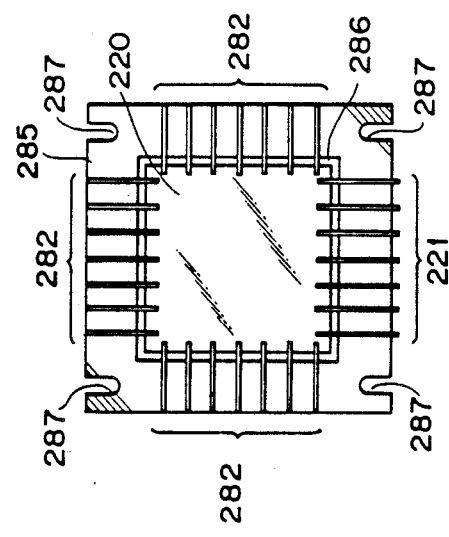
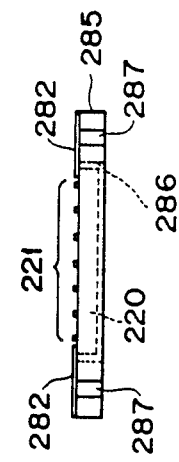
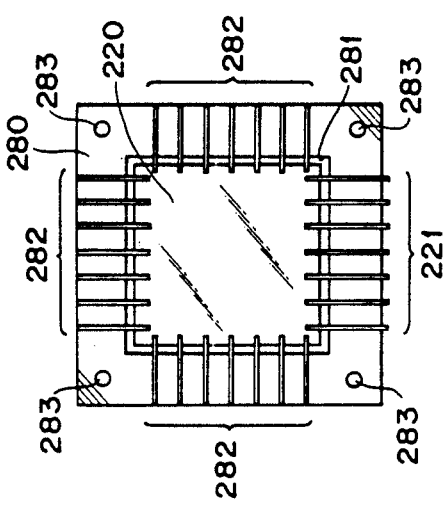
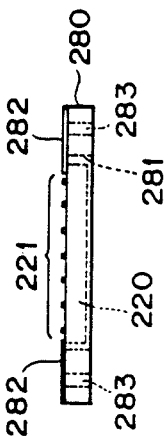

FIG.20A
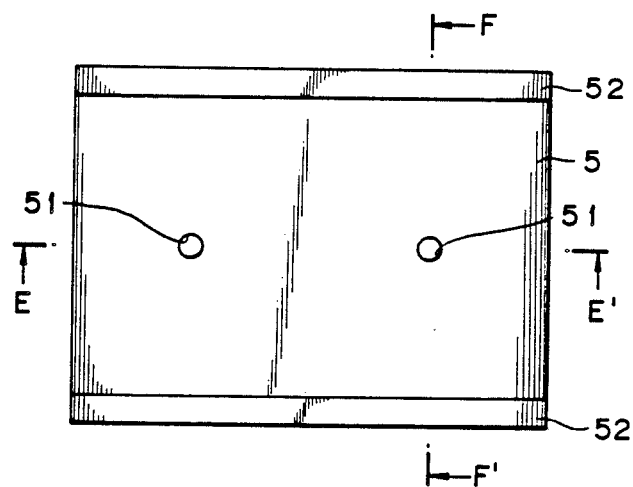
FIG.20B
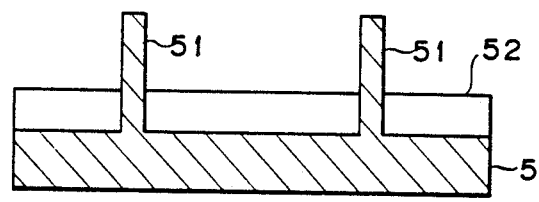
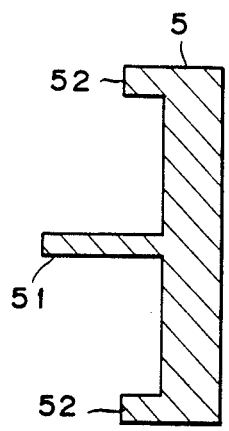
FIG.20C

THREE-DIMENSIONAL PACKAGING OF SEMICONDUCTOR DEVICE CHIPS

TECHNICAL FIELD

The present invention relates to a three-dimensional packaging structure of semiconductor device chips in which a plurality of semiconductor device chips such as IC chips and LSI chips are stacked in their thickness direction to be packaged in a three-dimensional manner in such a way that the respective chips are interconnected. The invention also relates to an elementary unit of the structure and a method for manufacturing the structure.

BACKGROUND ART

In general, this type of semiconductor device chip is flatly packaged in a package, and accordingly such package is very bulky in comparison with the chip itself. As semiconductor devices become more highly integrated and more functional, it becomes more important that such chips be packaged three-dimensionally in a high density condition. In order to stack and three-dimensionally package semiconductor device chips, the following various methods have been proposed.

As a first example of such proposals, there is a method (Japanese Patent Application Laid-Open No. 72,156/1984) that packages carrying IC chips and provided with lead terminals and sockets are stacked to establish alternate connections of the lead terminals and the sockets between the adjacent packages thus stacked This method is advantageous in that the IC chips are easily exchangeable In spite of this advantage, the method suffers from other disadvantages such as: its manufacturing step efficiency is poor since IC chips are packaged one by one; there is no possibility of freely reducing the stacking intervals of the chips, because the sockets restrict such reduction of the stacking intervals; and packaging of a large number of the chips is difficult, because the thickness of an elementary unit of the thus stacked structure can not be reduced thereby restricting the number of pieces of the chips that can be stacked.

As a second example of the proposals, there is a method (IBM Technical Disclosure Bulletin, Vol. 17, No. 10, March 1975, pp 3084–3086, K. R. Grebe) that a film carrier carrying semiconductor device chips is repeatedly folded into an S-shaped construction to stack the chips. While this method is advantageous in easy packaging, this method has a disadvantage that a long wiring length is required to interconnect the chips, so that device-speed is reduced Further, this method has a problem in device-strength, because the chip must be supported only through its portion connected to the film carrier.

As a third example of the proposals, there is a method (Japanese Patent Application No. 140,658/1984) that a bare chip is engaged in a case having a groove the shape of which is similar to that of the chip so as to form an assembly which is received by a plate to establish wiring connections. This method, while advantageous in short wiring length between the chip and the plate, suffers from a poor yield due to difficulty in insulating the chip's end portions and fine working is required in manufacturing a frame having a shape similar to the chip's shape, so that the cost of the thus obtained three-dimensional structure is expensive.

Furthermore, in such a three-dimensional packaging structure, as the number of stacked layers increases, it becomes a serious problem how to dissipate heat generated in the semiconductor device chips. Consequently, it is required that a suitable radiator construction is provided in the three-dimensional packaging structure.

SUMMARY OF THE INVENTION

Therefore, it is an object of the present invention to provide a three-dimensional packaging structure of semiconductor device chips, an elementary unit thereof and a manufacturing method thereof, which solve the above-mentioned problems inherent to the prior art and increase the efficiency of the manufacturing steps thereof by collectively connecting leads (electrode connecting wires) of the semiconductor device chip to a wiring plate.

It is another object of the present invention to provide a three-dimensional packaging structure of semiconductor device chips, an elementary unit thereof and a manufacturing method thereof, which solve the above problems inherent to the prior art and enable the intervals between the semiconductor device chips to be reduced.

It is a further object of the present invention to provide a three-dimensional packaging structure of semiconductor device chips, an elementary unit thereof and a manufacturing method thereof, which solve the above problems inherent to the prior art, make it easy to connect the semiconductor device chips to a wiring member, and provide a high accuracy in positioning and a sufficient reliability in connections.

It is still a further object of the present invention to provide a three-dimensional structure of semiconductor device chips, an elementary unit thereof and a manufacturing method thereof, in which a film carrier carrying the semiconductor device chips and an elastic thin film are stacked, and which make it possible to reduce the thickness of a three-dimensional structure as much as possible, and also make it possible that such a thickness of the structure is determined with a high accuracy.

It is still a further object of the present invention to provide a three-dimensional structure of semiconductor device chips, an elementary unit thereof and a manufacturing method thereof, which make it possible to the stacking pitches of the chips equal to each other in their stacking direction.

It is yet a further object of the present invention to provide a three-dimensional structure of semiconductor device chips, an elementary unit thereof and a manufacturing method thereof, which are so constructed that heat generated in such semiconductor device chips is adequately dissipated from the chips.

In the first aspect of the present invention, an elementary unit for a three-dimensional packaging structure of semiconductor device chips, comprises:

a semiconductor device chip containing a semiconductor device;

a chip carrying member having a device opening with which the semiconductor device chip is loosely engaged and an aligning aperture, the chip carrying member having leads which are disposed on one of its main surfaces and are connected to the semiconductor device chip to hold the semiconductor device chip; and a plastic insulating material layer having an aligning aperture which is aligned with the aligning aperture of the chip carrying member, the plastic insulating material layer being fixed to the other of the main surfaces of the chip carrying member.

Here, the elementary unit may comprise a thermal conductive layer being brought into contact with the semiconductor device chip and extending outwards from the chip carrying member.

The plastic insulating material layer may comprise:

a first plastic insulating material layer having an opening with which the semiconductor device chip is loosely engaged and being fixed to the other of the main surfaces of the chip carrying member; and a second plastic insulating material layer fixed to the first plastic insulating material layer Alternatively, the plastic insulating material layer may have an opening with which the semiconductor device chip is loosely engaged and being fixed to the other of the main surfaces of the chip carrying member.

The above-described thermal conductive layer may be disposed on the one of the main surfaces of the chip carrying member.

A thermal conductive layer may be interposed between the first and second plastic insulating material layers, and the thermal conductive layer may be brought into contact with the semiconductor device chip and extends outwards from the chip carrying member.

The chip carrying member may be a film carrier.

In the second aspect of the present invention, a three-dimensional packaging structure of semiconductor device chips, comprises:

a laminated structure in which a plurality of chip carrying members, each of which has a device opening with which a semiconductor device chip accommodating a semiconductor device is loosely engaged and an aligning aperture, which is in the form of a thin film and which has leads which are disposed on one of its main surfaces in an electrically insulated condition and are connected to the semiconductor device chip to hold the semiconductor device chip, are stacked in a manner that an aligning rod is inserted into the aligning aperture, and in which external connection leads of the leads are disposed on at least one plane of the laminated structure, which is perpendicular to the lamination direction of the laminated structure; and a wiring member having an electrically conductive pattern which is electrically connected to the external connection leads in a direction of the plane of the laminated structure, the external connection leads being exposed from the one plane.

Here, the wiring member may be a wiring board provided with the electrically conductive pattern and bumps disposed on the electrically conductive pattern connect the external connection leads to the electrically conductive pattern.

Alternatively, the wiring member may comprise:

an insulating layer in which the external connection leads are embedded such that surfaces of free ends of the external connection leads are substantially coplaner with a surface of the insulating layer; and a wiring layer which is disposed on the surface of the insulating layer and is provided with the electrically conductive pattern which electrically connects the external connection leads to each other.

In the above three-dimensional packaging structure of semiconductor device chips, a plurality of elementary units, each of which comprises the chip carrying member and plastic insulating material layer which has an aligning aperture aligned with the aligning aperture and is fixed to the other of the main surfaces of the chip carrying member may be stacked in a manner that an aligning rod is inserted into the aligning apertures so as to form a laminated structure; and in the laminated structure, the chip carrying member and the plastic insulating material layer may be alternately disposed.

Alternatively, in the three-dimensional packaging structure of semiconductor device chips, a plurality of elementary units, each of which comprises the chip carrying member, the plastic insulating material layer and a thermal conductive layer which contacts the semiconductor device chip and extends outwards from the chip carrying member, may be stacked in a manner that an aligning rod is inserted into the aligning apertures, so as to form a laminated structure; and in the laminated structure, the chip carrying member and the plastic insulating material layer may be alternately disposed, and, in a surface opposite to the surface of the laminated structure, a radiator board can be arranged to embed a thermal conductive layer extending from the opposite surface to cover the surface opposite to the surface.

Connections of the external connection leads to the wiring board may be established through an intermediate board having a hole disposed at a position corresponding to the external connection leads, and the external connection leads may be vertically embedded in bumps on the wiring board. Alternatively, free end portions of the external connection leads may be collectively bent to form bent portions on the same plane and the bent portions may be connected to the bumps on the wiring board.

In the above three-dimensional packaging structure of semiconductor device chips, the semiconductor device chip may be mounted on the chip carrying member in a manner that an upper surface of the semiconductor device chip is slightly lower than that of an upper surface of the chip carrying member, and the leads may extend from a side surface of the chip carrying member along grooves which are provided on a surface of the chip carrying member in an electrically insulated manner.

Here, the chip carrying member may be a film carrier, and a first and a second fixing boards may be disposed on a first and a second main surfaces of the laminated structure, respectively, so that the laminated structure is fixed.

In the third aspect of the present invention, a method for manufacturing an elementary unit of a three-dimensional packaging structure of semiconductor device chips, comprises the steps of:

forming a device opening with which a semiconductor device chip accomodating a semiconductor device is loosely engaged and an aligning aperture in a film carrier;

coating one of main surfaces of the film carrier with a metal thin film;

forming leads and a wiring pattern, the leads extending from the metal thin film into the device opening, and the wiring pattern being integrally connected to the leads and extending outwards from at least one of the sides of the film carrier;

overlaying a plastic insulating material layer having an aligning aperture aligned with the aligning aperture on the other of the main surfaces of the film carrier in such a way that the aligning apertures of the film carrier and the plastic insulating material layer are aligned with each other; and heating and compressing the film carrier and the plastic insulating material layer thus overlaid to form a laminated structure as an elementary unit having a predetermined thickness.

Here, a pattern for heat dissipation may be formed from the metal thin film in addition to the leads and the wiring pattern. The pattern can protrude into the device opening and can extend outwards from at least one of the sides of the film carrier.

In the method for manufacturing an elementary unit of a three-dimensional packaging structure of semiconductor device chips, it may comprise, after forming the leads, the wiring pattern and the pattern for heat dissipation, the steps of:

overlaying on the other of the main surfaces of the film carrier a first plastic insulating material layer having an aligning aperture aligned with the aligning aperture and an opening with which the semiconductor device chip is loosely engaged; a thermal conductive layer having an aligning aperture aligned with the aligning aperture of the film carrier, and an opening with which the semiconductor device chip is loosely engaged, and a second plastic insulating material layer having an aligning aperture aligned with the positioning aperture of the film carrier in this order, in such a way that the respective aligning apertures of the film carrier, the first plastic insulating material layer, the thermal conductive layer and the second plastic insulating material layer are aligned with each other; and heating and compressing the film carrier, the first plastic insulating material layer, the thermal conductive layer and the second plastic insulating material layer thus overlaid to form a laminated structure as an elementary unit having a predetermined thickness.

In the fouth aspect of the present invention, a method for manufacturing a three-dimensional packaging structure of semiconductor device chips, comprises the steps of:

forming a recess or opening, grooves and apertures or notches in each of chip carrying members, each mounting a semiconductor device chip, the recess or opening having such a depth that when the semiconductor device chip is mounted therein an upper surface of the semiconductor device chip is placed in a position slightly lower than that of an upper surface of the chip carrying member, each of the grooves having an electrically insulated surface for guiding each of the leads of the semiconductor device chip to a side of the chip carrying member, and each of the apertures or notches serving as an aligning guide in a laminating procedure;

bonding and fitting the semiconductor device chip to each of the chip carrying members thus formed, to guide the leads of the semiconductor device chip to a side surface of the film carrier along the grooves;

stacking a plurality of the chip carrying members thus carrying the chips, in a thickness direction of the chip carrying member, and fixing the chip carrying members thus stacked through the apertures; and connecting each end of the leads of each of the semiconductor device chip to each of bumps of a wiring board which is disposed substantially perpendicularly with respect to the semiconductor device chip.

In the fifth aspect of the present invention, a method for manufacturing the three-dimensional packaging structure of the semiconductor device chips comprises the steps of:

forming a device opening, with which a semiconductor device chip accommodating a semiconductor device is loosely engaged, and an aligning aperture in a film carrier;

coating one of the main surfaces of the film carrier with a metal thin film;

forming leads and a wiring pattern, the leads extending from the metal thin film into the device opening, and the wiring pattern being integrally connected to the leads and extending outwards from at least one of the sides of the film carrier;

overlaying a plastic insulating material layer having an aligning aperture aligned with the aligning aperture on the other of the main surfaces of the film carrier in such way that the aligning apertures of the film carrier and the plastic insulating material layer are aligned with each other;

heating and compressing the film carrier and the plastic insulating material layer thus overlaid to form an elementary unit having a predetermined thickness; and stacking a plurality of elementary units to form a laminated structure in such a way that an aligning rod is inserted into the aligning apertures so as to align the plurality of elementary units with each other, that the film carrier and the plastic insulating material layer are alternately disposed, and that external connection leads of the leads are disposed on at least one of surfaces perpendicular to the laminating direction of the laminated structure.

A method for manufacturing a three-dimensional packaging structure of the semiconductor device chips may comprise the steps of:

forming a pattern for heat dissipation in addition to the leads and the wiring pattern, the pattern protruding into the device opening and extending outwards from at least one of the sides of the film carrier; and covering a surface of the laminated structure, from which the thermal conductive layer projects, with a heat dissipating plate which contacts the thermal conductive layer.

The method for manufacturing a three-dimensional packaging structure of the semiconductor device chips may comprise, after forming the leads, the wiring pattern and the pattern for heat dissipation, the steps of:

overlaying on the other of the main surfaces of the film carrier a first plastic insulating material layer having an aligning aperture aligned with the aligning aperture and an opening with which the semiconductor device chip is loosely engaged; a thermal conductive layer having an aligning aperture aligned with the aligning aperture of the film carrier; and a second plastic insulating material layer having an aligning aperture aligned with the aligning aperture of the film carrier, in this order in such a way that the respective aligning apertures of the film carrier, the first plastic insulating material layer, the thermal conductive layer, and the second plastic insulating material layer are aligned with each other;

heating and compressing the film carrier, the first plastic insulating material layer, the thermal conductive layer and the second plastic insulating material layer thus overlaid to form an elementary unit having a predetermined thickness;

stacking a plurality of elementary units to form a laminated structure in such a way that an aligning rod is inserted into the aligning apertures so as to align the plurality of the elementary units with each other, that the film carrier and the second plastic insulating material layer are alternately disposed, and that external connection leads of the leads are disposed on a surface perpendicular to a laminating direction of the laminated structure; and covering a surface of the laminated structure, from which the thermal conductive layer projects, with a heat dissipating plate which contacts the thermal conductive layer.

In the sixth aspect of the present invention, a method for manufacturing a three-dimensional packaging structure of semiconductor device chips, comprises the steps of:

stacking film carriers, each of which carries a semiconductor device chip and leads which are connected to the semiconductor device chip and extend from the film carrier;

fixing the thus stacked structure;

adhering an insulating material layer to a surface of the stacked structure, on which the leads which extend from the fixed stacked structure are arranged;

planarizing a surface of the insulating material layer thus adhered; and forming a metal layer on the thus planarized surface, the metal layer having an electrically conductive pattern to be connected to the leads.

In the seventh aspect of the present invention, a method for manufacturing a three-dimensional packaging structure of semiconductor device chips, comprises the steps of:

stacking film carriers, each of which carries a semiconductor device chip and leads which are connected to the semiconductor device chip and extend from the film carrier;

fixing the stacked structure; and connecting each end of the leads projecting from the stacked structure thus fixed to each of bumps of a wiring board which is arranged substantially perpendicularly to the semiconductor device chip.

BRIEF DESCRIPTION OF THE DRAWINGS

FIGS. 8A and 8B and FIGS. 9A and 9B are two pairs of a plan view and a side view of two embodiments of a film carrier on which an LSI chip is mounted, respectively;

FIG. 20A is a plan view showing an embodiment of the other jig to be employed in the present invention;

FIGS. 20B and 20C are sectional views taken along lines E-E' and F-F' of FIG. 20A, respectively, to show the jig shown in FIG. 20A;

DESCRIPTION OF THE PREFERRED EMBODIMENTS

Figure 1A:
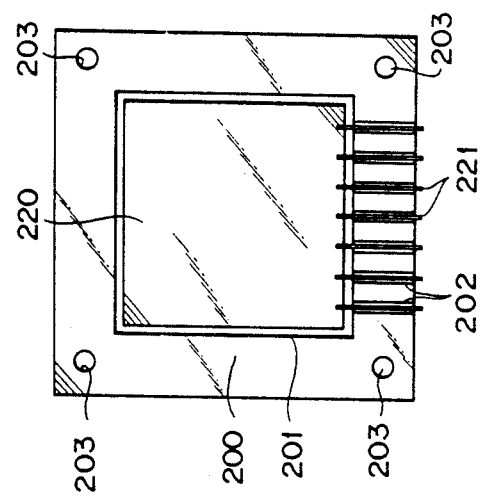
FIGS. 1A and 1B are a plan view and a side view showing a chip carrying member in an embodiment of the present invention, respectively.
Figure 1B:
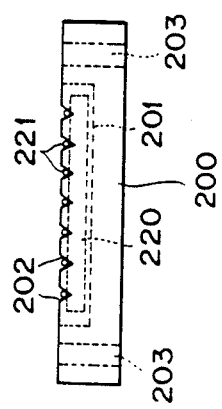

FIGS. 1A and 1B show an embodiment of a chip carrying member for carrying a semiconductor device chip such as an LSI chip to be stacked in embodiments of the present invention to be explained hereinafter. In FIGS. 1A and 1B, reference numeral 200 denotes a frame as a member for carrying a chip 220; 201, a recess formed in the frame 200 for receiving the chip 220; 202, grooves, each for receiving a lead 221 of the chip 220; and 203, alignment apertures.

While the frame 200 can be formed from any of ceramics such as alumina or metals such as Mo (molybdenum) or semiconductors such as Si (silicon), it is necessary that the surface of each 202 and a plane on which a wiring plate to be described later is disposed, i.e., a surface appearing in the front of FIG. 1B are in an insulated condition, in order to prevent a short circuit between the leads 221 of the LSI chip 220. In case the frame 200 is formed of a metal or semiconductor, it is possible to make the surface of the frame 200 in an insulated condition by coating the surface with an insulating film such as $SiO_2$ (silicon dioxide) by a method such as the sputtering process, or by oxidizing the surface of the frame 200.

The recess 201 is provided for loosely receiving the LSI chip 220 therein, and formed to such a depth in an upper surface of the frame 200 that, when the chip 220 is inserted in the recess 201, the upper surface of the chip 220 is slightly lower than the upper surface of the frame 200.

In order to guide the leads 221 extending from the LSI chip 220 and to project the leads 221 from a side surface of the frame 200, the grooves 202 are formed in the upper surface of the frame 200. Each alignment aperture 203 acts as a through-hole into which a bolt is inserted when a plurality of the chip carrying members 200 are stacked in their thickness direction.

Figure 2A:
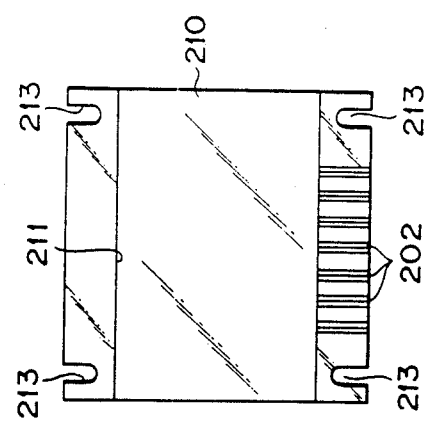
FIGS. 2A and 2B are a plan view and a side view showing another embodiment of the chip carrying member, respectively.
Figure 2B:
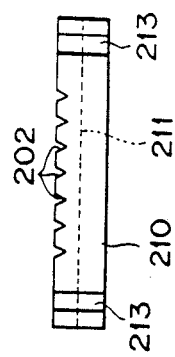

Further, as shown in FIGS. 2A and 2B, it is possible to employ, as a chip carrying member, a frame 210 provided with a trench 211 for receiving the chip 220 in place of the frame 200, and also possible to provide alignment notches 213 in place of the alignment apertures 203. Incidentally, the following description will be made as to the chip carrying member shown in FIGS. 1A and 1B.

On the LSI chip 220 are mounted the leads 221 for wiring connections in a manner that the leads 221 have substantially the same projecting lengths. The LSI chip 220 is so bonded to the frame 200 that the leads 221 are inserted into the grooves 202 and supported therein, while the projected length of the leads 221 from the side surface of the frame 200 to the free end is substantially constant.

Figure 3:
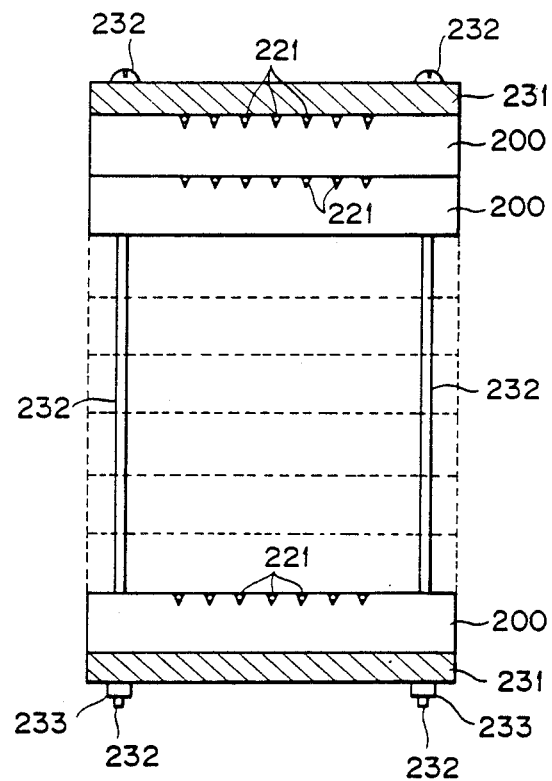
FIG. 3 is a side view showing a three-dimensional packaging structure in which the chip carrying members are stacked.

FIG. 3 shows an embodiment of a three-dimensional LSI-packaging structure which is formed by stacking a plurality of the frames 200, each of which carries the LSI chip 220 as shown in FIGS. 1A and 1B and fixing the stacked 200. In FIG. 3, reference numeral 231 denotes upper and lower fixing plates which have the same size as that of the frame 200 and are provided with alignment apertures corresponding to those of the frame 200; 232, bolts; and 233, nuts. The structure shown in FIG. 3 is so constructed that after the bolts 232 are inserted into each of the four alignment apertures provided at the four corners of the upper plate 231, the frames 200 carrying the chips, and the lower fixing plate 231, sequentially stacking the components in this order, they are then clamped to each other by means of the bolts 232 and the nuts 233.

In this manner, a laminated structure is obtained, in which the pitches of the leads 221 are made equal to each other in each of the laminated structures lateral and longitudinal directions, and the free ends of the leads 221 are positioned in the same plane.

Figure 4:
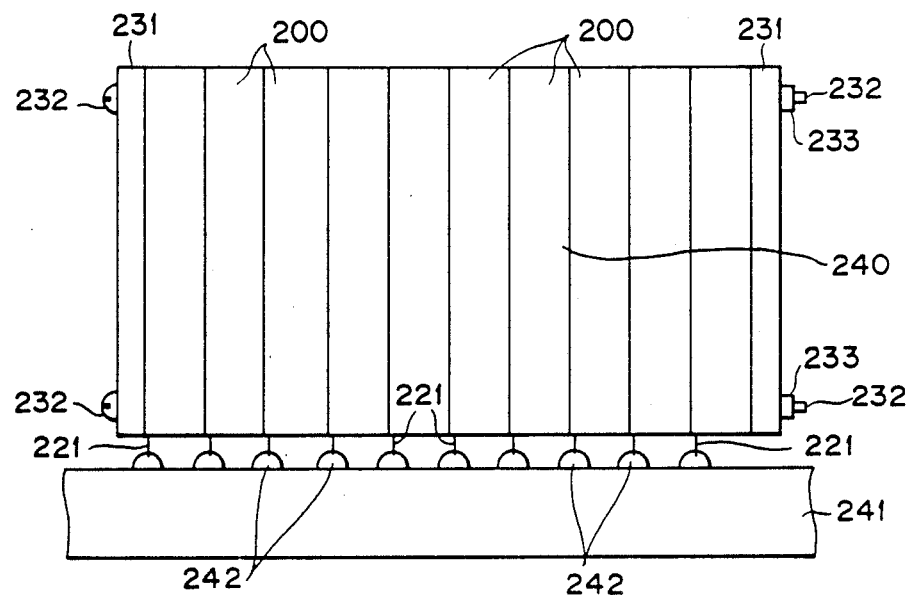
FIGS. 4 and 5 are side views showing two embodiments of a connection of the stacked structure shown in FIG. 3 to a wiring plate.

FIG. 4 shows an embodiment of connections of each of the leads 221 to a wiring plate in the laminated structure shown in FIG. 3. In FIG. 4, reference numeral 240 denotes the laminated structure shown in FIG. 3; 241, a wiring plate; and 242, bumps on the wiring plate 241. When performing the connections, soldering bumps are employed, as for example, in the case of conventional CCB (controlled collapse bonding) techniques. Namely, the bumps 242 on the wiring plate 241 are aligned in their positions with the leads 221 extending from the structure 240, and then the wiring plate 241 is so moved toward the structure 240 while heating the bumps 242 that the leads 221 are vertically buried into the heated bumps 242. As a result, the plate 241 and the structure 240 are connected to each other.

Figure 5:
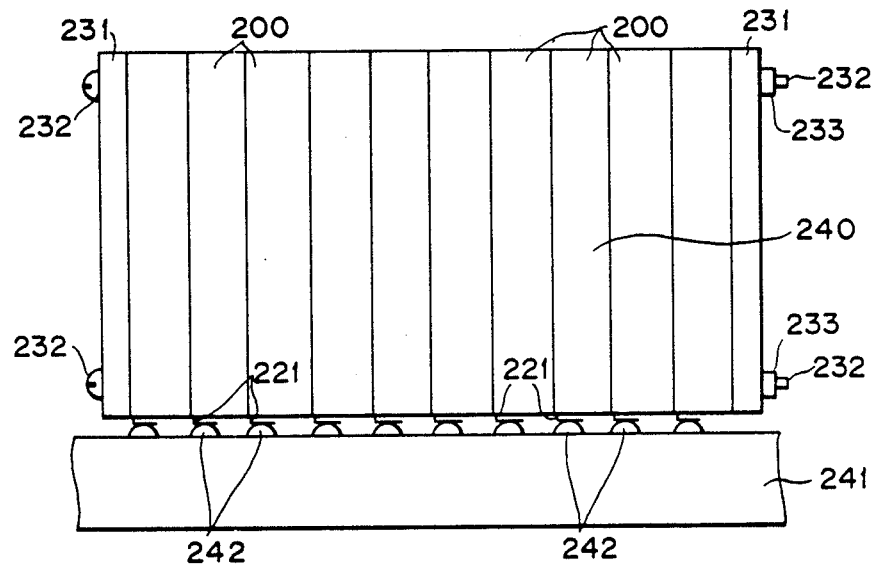

FIG. 5 shows another embodiment of the connection of each of the leads 221 of the laminated structure shown in FIG. 3 to the wiring plate. This embodiment is different from that shown in FIG. 4 in that the free end portions of the leads 221 extending from the structure 240 are bent substantially at a right angle and then connected to the bumps 242 on the wiring plate 241. Such construction in which the leads 221 are bent is advantageous when the diameters of the leads 221 are too small to vertically bury the leads 221 into the bumps 242.

Figure 6:
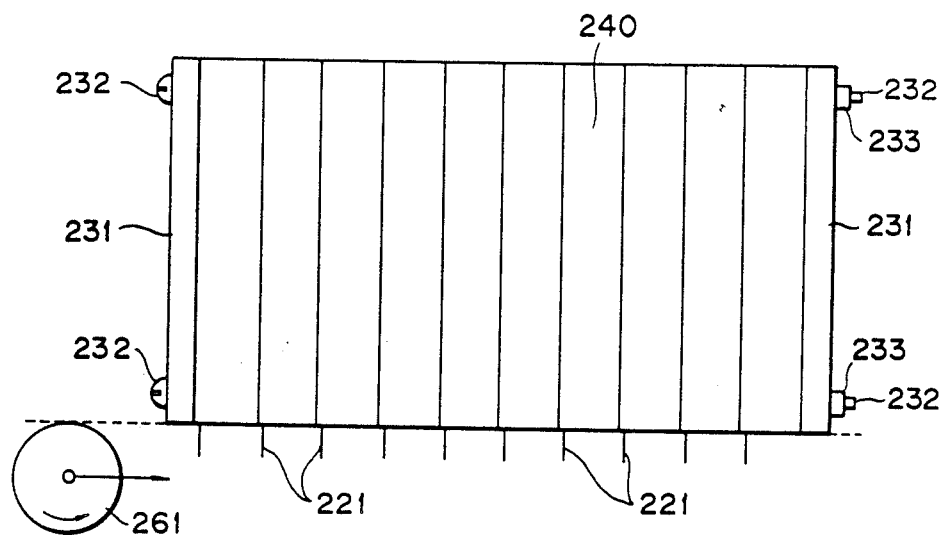
FIG. 6 is a side view showing a bending process in which leads are bent at right angles along a side surface of the laminated structure.

Now, FIG. 6 shows a manner of bending, the free end portions of the leads 221 at a right angle along the side surface of the frame 200. Reference numeral 261 denotes a bending roll which is rolled along the side surface of the laminated structure 240 to align a bending plane through which the free end portions of the leads 221 are bent at a right angle.

Figure 7:
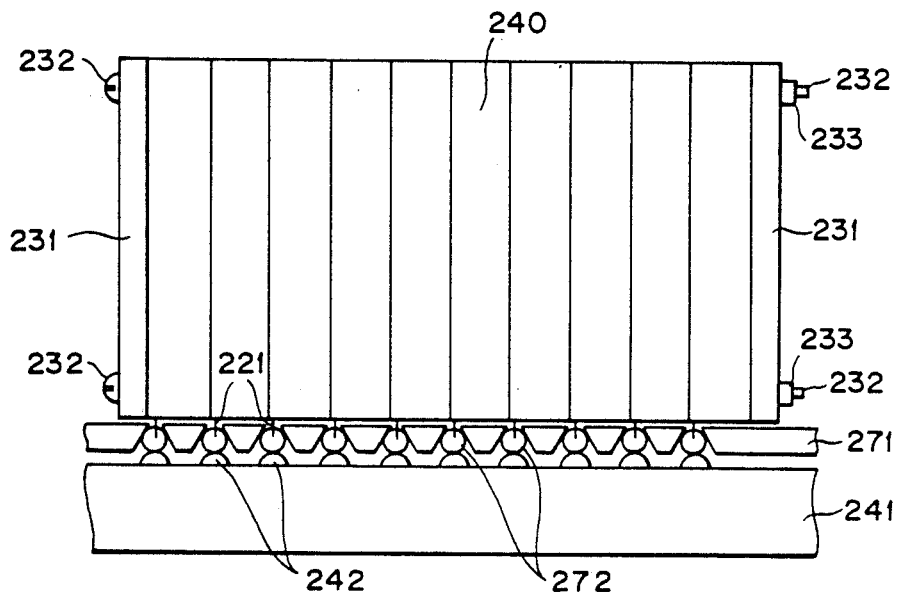
FIG. 7 is a side view showing another embodiment of the connection of the laminated structure to the wiring plate.

FIG. 7 shows a further embodiment of the connection of each of the leads 221 of the laminated structure shown in FIG. 3 to the wiring plate 241. Reference numeral 271 denotes an intermediate plate; and 272 solder balls. The connection is conducted according to the following sequence. First, the intermediate plate 271, which is provided with holes the pitch of which is the same as that of the leads 221 of the structure 240, is placed on the laminated structure 240 so as to make it possible that each of the leads 221 enters each of such holes.

It is sufficient that a surface layer of the intermediate plate 271 including at least inner surfaces of the holes of the plate 271 is formed of an electrically insulating material. For example, it is possible to obtain the holes in the form of a quadrangular pyramid with high accuracy when the intermediate plate 271 is formed of a single crystal Si of (100) lattice plane and photo-processing techniques are employed together with anisotropy etching techniques. The surface layer may be rendered to an insulating condition by oxidizing the surface layer.

Next, at the positions of the holes of the intermediate plate 271, there are formed solder balls 272 into which the leads 221 are buried. For accomplishing these formations, the solder balls 272 may be disposed in the holes and then heated, or it is possible to apply a masking evaporation of solder from a rear surface of the intermediate plate 271 to the positions of the holes thereof and then to heat the solder.

The thus formed structure to which both the solder balls 272 and the intermediate plate 271 are fitted can be connected to the bumps 242 on the wiring plate 241 by the conventional CCB techniques which are widely used. This structure employing the intermediate plate 271 as shown in FIG. 7 is advantageous, as well as the structure in which the leads 221 are bent as shown in FIG. 5, in the case in which the leads 221 have a thin diameter so that it is difficult to vertically bury into the leads 221 in the bumps 242, as shown in FIG. 4.

FIGS. 8A and 8B, and FIGS. 9A and 9B show two embodiments in which chip carrying members in the form of a film carrier 280 and a film carrier 285 carry the LSI chips 220, respectively. In the embodiment shown in FIGS. 8A and 8B, aligning apertures 283 are formed in the film carrier 280. In the other embodiment shown in FIGS. 9A and 9B, aligning notches 287 are formed in the film carrier 285. Reference numerals 281 and 286 denote openings which are formed in the film carriers 280 and 285, for loosely engaging the chips 220 therein, respectively. Reference numeral 282 denotes dummy leads which project from sides of the film carriers, from which the leads 221 do not project, in the same manner as that of the leads 221.

The chip 220 is mounted on the film carrier 280 or 285 by a normal inner-lead bonding technique, i.e., by connecting the leads 221 and the dummy leads 282 to the chip 220. Incidentally, the opening 281 or 286 and the aligning aperture 283 or the aligning notch 287 are previously formed in a film carrier roll tape (not shown). The film carrier roll tape is cut to the size of the film carrier 280 or 285 shown in the drawings, after the chips 20 are mounted on the roll tape. In this cutting operation, the end portions of the leads 221 are projected from the cut surfaces of the film carrier 280 or 285 by a length sufficient to be connected to the bumps 242 of the wiring plate 241 as shown in FIG. 4.

Figure 10:
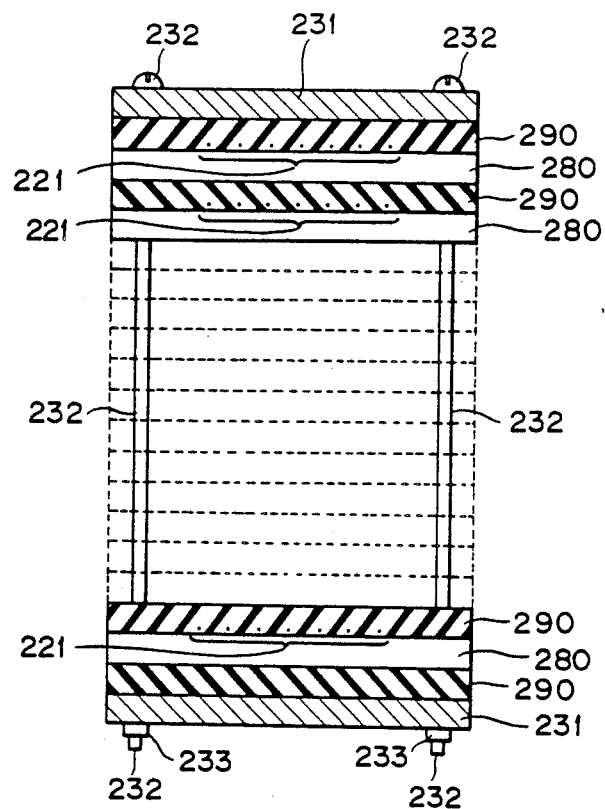
FIG. 10 is a side view showing a three-dimensional packaging structure in which the film carriers are stacked.

As shown in FIG. 10, the film carriers 280 (or 285), each of which carries the LSI chip 220 as shown in FIGS. 8A and 8B and FIGS. 9A and 9B, and spacers 290, each of which has substantially the same size as that of the film carrier and is provided with aligning apertures (or notches) placed at positions corresponding to those of the apertures 283 (or notches 287), are alternately stacked to form a laminated structure, while the bolts 232 are inserted into the apertures 283 (or notches 287) of the film carriers 280 (or 285) and the apertures (or notches) of the spacers 290, and then connected to the nuts 233 to fix the laminated structure through the fixing plates 231 which are disposed on opposite end sides of the laminated structure.

In this embodiment, in contrast with the laminated structure of the frames 200 shown in FIG. 3, the film carriers 280 (or 285) and the spacers 290 are alternately stacked. The spacer 290 is formed of a plastic material which is deformable in its thickness under pressure, so that the thickness of the structure having the LSI chip 220, the leads 221 and the dummy leads 282 mounted on the film carrier 280 (or 285) is adjustable when the above-described laminated structure is fixed.

Further, although it is preferable to employ a plastic material as the material for the spacer as described above, it is also possible to employ an elastic material which makes its thickness adjustable under the condition that pressure is kept applied thereto against its resiliency. In this specification, a property of the material, which makes it possible to adjust the thickness of the material when the material is subjected to pressure, is defined as "plasticity" including the elasticity in a broad sense.

Like the structure shown in FIG. 3, the laminated structure of this embodiment may be connected to the bumps 242 on the wiring plate 241 in the same manner as that shown in FIGS. 4-7.

According to the embodiments of the present invention described above, it is possible to stack the chip carrying members carrying the LSI chips and to fix the stacked members to form the three-dimensional LSI packaging structure, so that the electrodes (leads) can be easily aligned, without applying a special working to the chip. Therefore, the leads of the laminated structure can be collectively electrically connected to the wiring plate and thus the efficiency of the manufacturing process can be improved. Further, in this laminated structure, it is possible to reduce the thickness contributing to one LSI chip approximately to a thickness less than twice the thickness of the chip itself by reducing the thickness of the frame or film carrier for carrying the chip. Consequently, this laminated structure is advantageous in that the distance between the LSI chips is reduced, in comparison with a conventional structure in which the chips are separately aligned and connected to the wiring plate chip by chip. In addition to the above, this laminated structure is further advantageous in that it is not necessary to handle the LSI chip in its bare condition when the LSI chips are mounted on the film carrier, since it is possible to use the film carrier carrying the LSI chips, and therefore handling of the LSI chip is easy and there is no fear that it will be damaged.

Since the wiring connections between the LSI chips 220 are conducted by moving the wiring plate 241 having the solder bumps 242 toward the laminated structure of FIG. 10 while heating the wiring plate 241, so that the leads 221 are buried in the solder bumps 242, it is difficult to uniformly heat the entire wiring plate 241 when the leads 221 are buried in the solder bumps 242. As a result, it may happen that the temperature of the thus heated bumps 242 is varied according to their position on the wiring plate 241, so that the leads are not buried under the proper temperature condition and consequently there is the possibility that the lead 221 is bent and/or the connection portion has a high resistance. These are factors deteriorating the reliability of the connection.

Furthermore, when the opposite surfaces having the leads 221 and the bumps 242, respectively, are aligned in case of connecting the leads 221 to the bumps 242, it is necessary to interpose a half-mirror between the leads 221 and the bumps 242 or to provide concave and convex portions in the chip carrying members 200 and the wiring plate 241, respectively, so that they are engaged with each other by mechanical coupling, in order to connect the leads 221 to the wiring plate 241 by the above-described CCB (Controlled Collapse Bonding) techniques. In the former case using the half-mirror, there is a problem that precise aligning equipment is required for increasing the accuracy of alignment in a connecting process, while in the latter case there is the problem that precise machining should be applied to the chip carrying member 200 and the wiring plate 241. In either case, there is a limit in the accuracy of alignment.

Figure 11:
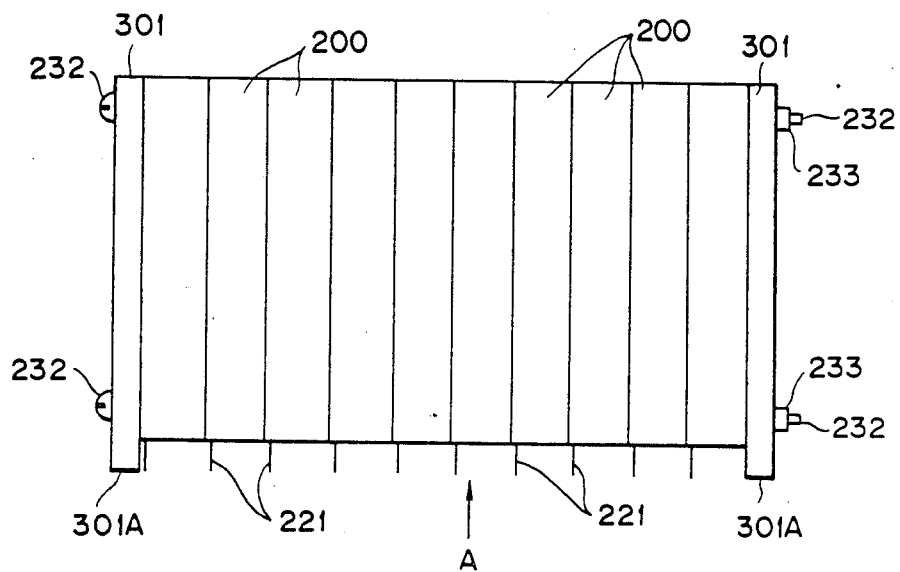
FIG. 11 is a sectional view showing a laminated structure of LSI chips in another embodiment of the present invention.

FIG. 11 shows a laminated structure in another embodiment of the present invention in which these problems are solved. In FIG. 11, parts similar to those of FIG. 4 are denoted by the same reference numerals as those in FIG. 4. In this embodiment, reference numeral 301 denotes a fixing plate corresponding to the fixing plate 231. While the size of the fixing plate 231 is substantially similar to those of the chip carrying members 200, 210, 280 and 285, the fixing plate 301 of this embodiment has its end portion 301A extended from an end portion of the chip carrying member 200 to the vicinity of the free ends of the leads 221. The reason for such extension is to form a wall (outer frame) of a recess for filling resin to be described hereinafter.

Figure 12:
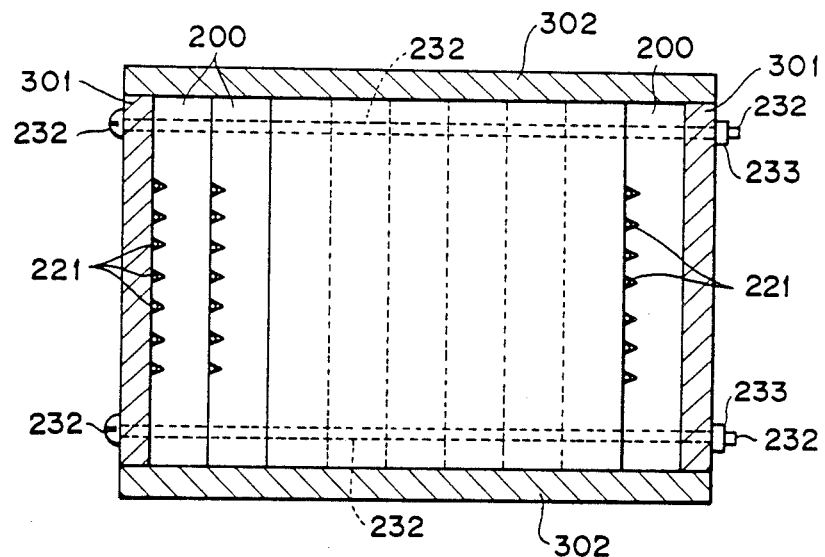
FIG. 12 is a plan view showing the laminated structure shown in FIG. 11, taken in the direction of arrow A.

FIG. 12 is a plan view viewed in the direction of arrow "A" of FIG. 11, wherein reference numeral 302 denotes a side fixing plate. The side fixing plate 302 has a length similar to that of the end fixing plate 301 and has its end portion extended from the end portion of the chip carrying member 200 like the fixing plate 301. Both the fixing plates 301 and 302 are fixed by bolts or the like to construct an outer frame for filling the resin described later.

In this embodiment, the end fixing plate 301 and the side fixing plate 302 define the outer frame in which the resin is poured so that the leads 221 of the laminated structure shown in FIGS. 11 and 12 are buried in the resin. In this embodiment, although various organic materials may be employed as the resin, polyimide resin is most suitable in view of its properties of thermal stability after hardening.

After polyimide resin is poured into the recess at room temperature, the polyimide resin is baked at a temperature substantially within the range from 200° C. to 400° C. for several tens of minutes to harden the polyimide resin.

Figure 13:
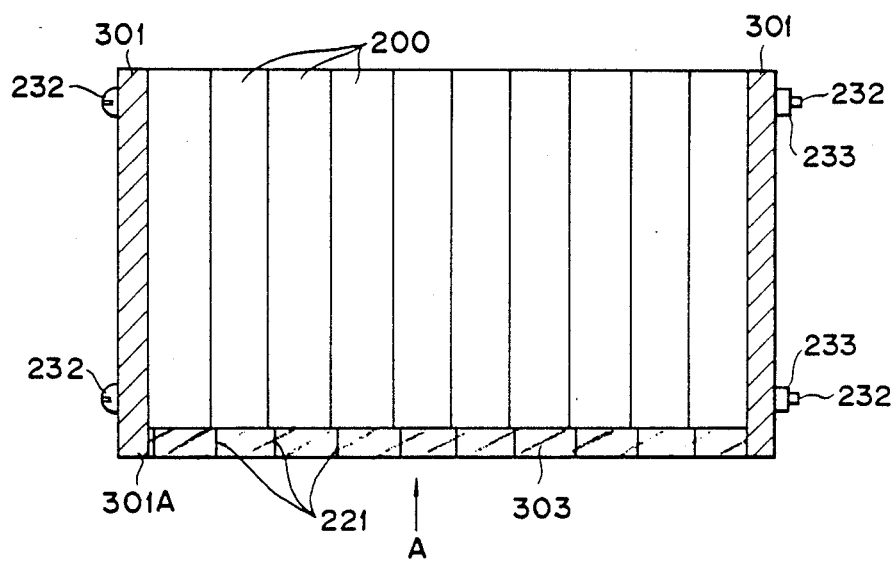
FIG. 13 is a sectional view showing an embodiment of the structure after resin is embedded to planarize its surface.
Figure 14:
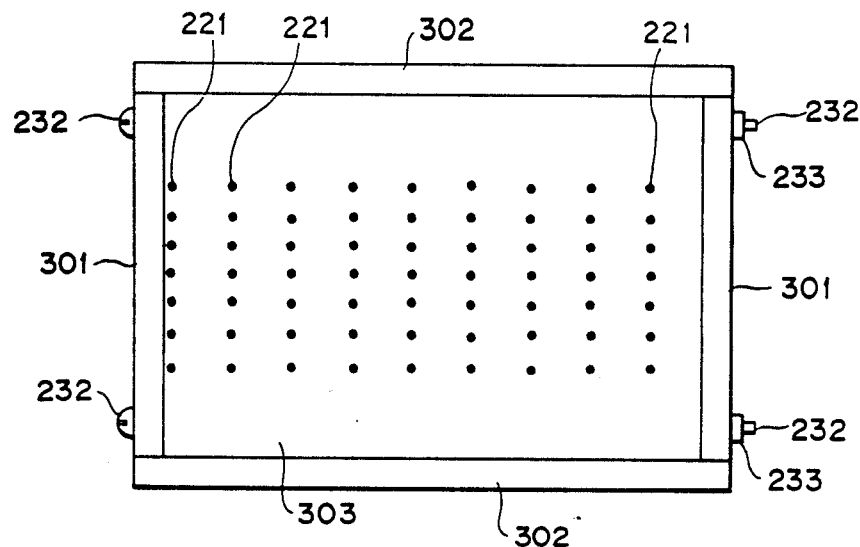
FIG. 14 is a plan view showing the structure shown in FIG. 13, taken in the direction of arrow A.

Subsequently, the surface of the hardened resin is planarized by machining together with the outer frame composed of the end fixing plate 301 and the side fixing plate 302, so that the structure shown in FIGS. 13 and 14 is obtained. FIG. 13 is a sectional view corresponding to FIG. 11. FIG. 14 is a plan view viewed in the direction of arrow "A" of FIG. 13 and corresponding to FIG. 12. In FIGS. 13 and 14, reference numeral 303 denotes a resin layer formed through such pouring, hardening and planarizing processing of the resin.

In the above machining work, it is preferable that grinding work is first conducted, and then lapping and polishing work sequentially conducted by a lapping and polishing machine using an abrasive such as diamond paste or the like. Preferably, the lapping and the polishing works are adequately selected according to the strength of the leads to be machined and the flatness of the flat surface to be obtained. In the thus obtained structure through the above works, the surface of the resin layer 303 is planarized by machining work, as shown in FIGS. 13 and 14 and the surfaces of the free ends of the leads 221 are disposed at a constant distance on the same plane as that of the resin surface.

Figure 15:
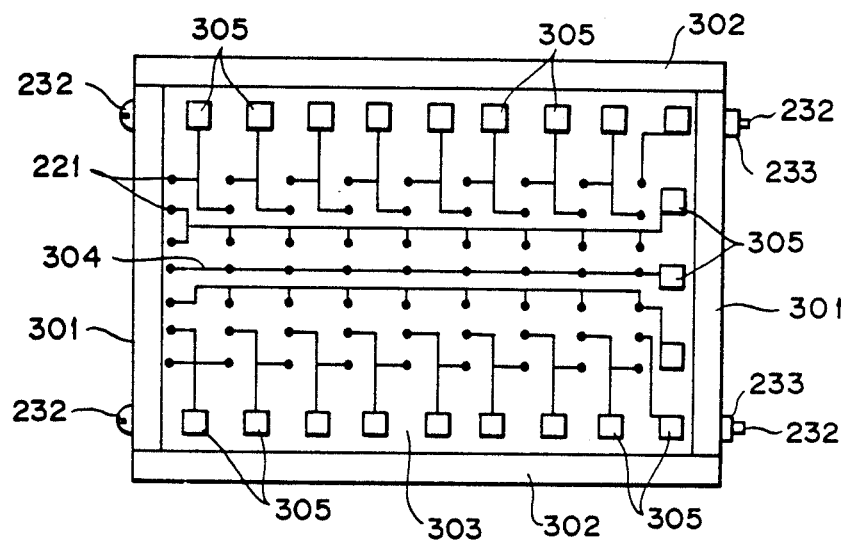
FIG. 15 is a plan view showing an embodiment of the structure after a metal wiring is formed.

FIG. 15 shows a structure in which a metal wiring is provided in the above structure shown in FIGS. 13 and 14. In FIG. 15, reference numeral 304 denotes a metal wiring; and 305 an electrode pad for external connection. In order to form the structure shown in FIG. 15, metal such as aluminum or the like is deposited on the entire surface of the resin 303, and then patternings of the metal wiring 304 and the electrode pads 305 are simultaneously conducted by photolithography and etching of the metal layer. According to this method, it is possible to conduct the alignment between the metallic wiring 304, the leads 221 and the metal wiring work with an accuracy of micron order by employing normal photolithography, so that it is possible to reduce the pitch between the leads 221 to form a high density wiring pattern.

While in the above embodiment, polyimide resin is employed as an insulator for filling the space between the leads of the structure, it is necessary to employ a harder material than the resin as the insulator between the leads when machining the flat surface, if the strength of the leads is not sufficient. In this case, it is possible to employ an inorganic insulator such as silicon oxide as the above insulator. In order to form this silicon oxide film, it is possible to use a CVD method or vacuum deposition method. However, it is most preferable that, as normally employed in the so-called spin-on-glass method, fluid material containing silicon oxide is poured into the outer frame at room temperature and then baking thereof is conducted for several tens of minutes at a temperature substantially within a range from 300° C. to 400° C., since the deposition speed is high in this case. Furthermore, it is also possible to employ as the insulator between the leads a multilayer structure composed of a first layer of polyimide resin and a second layer of silicon oxide film and so on.

While, in the above embodiment, the metal wiring for interconnecting the leads from the LSI chips is a single layer, it is also possible to form a multilayer structure the intended functions by alternately forming a metal wiring layer, an insulator layer and through-holes, as in the normal process of manufacturing LSI chips or a printed circuit plate.

Further, while in the above embodiment, there is shown a method in which, in order to form the metal wiring layer for interconnecting the leads extending from the LSI chips, metal deposition, photolithography and etching of the metal layer are performed, it is also possible to form such a metal wiring layer by positioning a mask having a pattern which is the reverse of that of the metal wiring layer with respect to the pattern of the leads and then depositing metal through the mask. However, this method is inferior to the above method employing photolithography with regard to both masking accuracy and wiring formation accuracy and the accuracies are of the order of several tens of microns, and hence this method can be employed only in case the pitch between the leads is sufficiently wide and low density wiring is allowed.

As described above, according to this embodiment, the connection of the leads to the wiring metal is not made by heating the solder bums but reinforces the leads by the insulator and then the wiring metal is deposited on the surfaces of the leads, which are co-planer with the surface of the insulator to perform direct connections, so that the leads are prevented from being bent when they are connected. As a result, this connection is reliable. Furthermore, the alignment between the leads and the wiring metal is performed by an alignment of the wiring metal when the wiring metal is subject to photolithography, or an alignment of the mask for depositing the wiring metal, i.e., an optical alignment from the wiring metal side, so that there is no need for a specially highly graded aligning equipment or for a precise machining of the chip carrying member and so on, in order that a highly precise alignment is accomplished. Therefore, it is easy to form a high density wiring in this embodiment.

As described above, when a frame such as a ceramic frame is used as the chip carrying member (FIG. 3), it is possible to form its shape with a high accuracy, but its cost increases. On the other hand, when the film carriers and the elastic spacers are alternately stacked (FIG. 10), it is possible to decrease the thickness of the thus formed three-dimensional structure and also to decrease its cost, while it is hard to keep constant the thickness of the structure in its stacking direction.

In view of these points, an embodiment in which the thickness of a structure having the film carriers and the elastic spacers stacked alternately is kept constant in its stacking direction with a high accuracy will be described below.

Figure 16A:
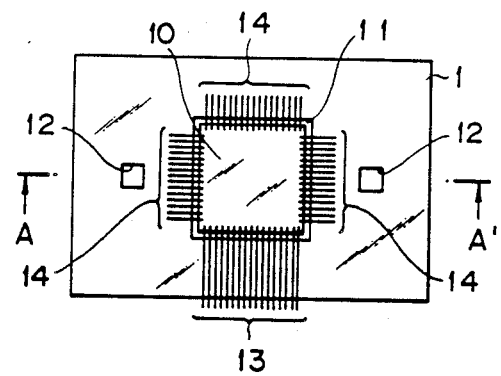
FIG. 16A is a plan view showing an embodiment of a film carrier for carrying the chip to be employed in the present invention.
Figure 16B:
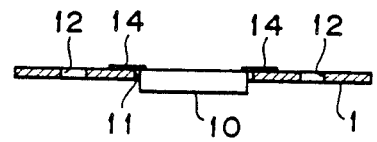
FIG. 16B is a sectional view taken along line A-A' of FIG. 16A.

FIGS. 16A and 16B show an embodiment of a film carrier carrying a semiconductor device chip, for example, an IC chip which is to be stacked in embodiments of the present invention described hereinbelow.

In FIGS. 16A and 16B, reference numeral 1 denotes a film carrier made of polyimide, glass-epoxy or BT resin, and having a thickness of 135 μm, for instance; and reference numeral 10 denotes an IC chip. In the film carrier 1, there are previously formed a device opening 11 in which the IC chip 10 is loosely engaged and aligning apertures 12, and patterns of outer connection leads 13 and dummy leads 14 are also previously formed. These leads 13 and 14 are made of copper having a thickness of, for example 135 μm. The outer connection leads 13 are not limited to be connected only to one side of the IC chip 10, but allowed to be connected to a plurality of sides thereof. Furthermore, the leads 13 are not limited to be projected from only one side of the film carrier, but allowed to be projected from other sides thereof.

The leads 13 and 14 disposed on the IC chip 10 and the film carrier 1 are connected by a usual inner-lead bonding method in which gold bumps disposed on the IC chip 10 are connected to the leads 13 and 14 by thermal compression bonding. The IC chip 10 is supported by the film carrier 1 through the leads 13 and 14 when the IC chip 10 is inserted into the opening 11, and electric signals from/to the chip to/from external circuits are inputted/outputted through the external connection leads 13 after the chips are stacked. The dummy leads 14 serve to fix the connection between the IC chip 10 and the film carrier 1. The aligning apertures 12 serve to align the IC chips 10 when the IC chips 10 are stacked with elastic thin films to be described later and when the IC chips 10 are stacked finally.

Figure 17A:
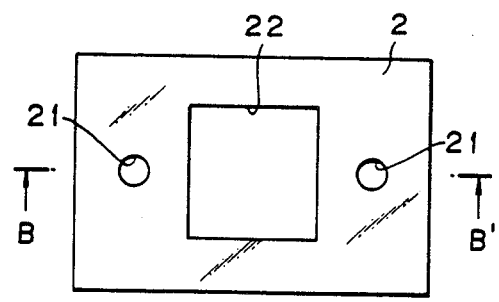
FIG. 17A is a plan view showing an embodiment of a first thermoplastic elastomer thin film to be employed in the present invention.
Figure 17B:
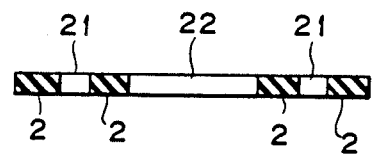
FIG. 17B is a sectional view taken along lines B-B' of FIG. 17A.

Next, FIGS. 17A and 17B show an embodiment of a first plastic thin film, for example, a thermoplastic elastic thin film such as a thermoplastic rubber film, which acts as a spacer with regard to the thickness of the IC chip 10 and a thickness compensating spacer when the first plastic thin film is stacked with the film carrier 1.

In FIGS. 17A and 17B, reference numeral 2 denotes the first thermoplastic elastic thin film in which aligning apertures and a device receiving opening 22 are previously formed. The first thermoplastic elastic thin film 2 is slightly smaller in outer dimensions than film carrier 1, considering a compressive deformation of the thin film 2 when the film 2 is stacked with the film carrier 1. For of the same reason, the aligning aperture 21 and the device opening 22 of the first thermoplastic elastic thin film 2 are slightly larger than the aligning apertures 12 and the device opening 11 of the film carrier 1, respectively.

Figure 18A:
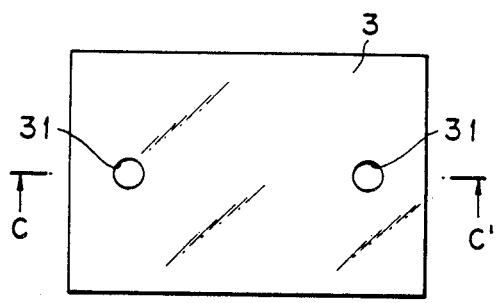
FIG. 18A is a plan view showing an embodiment of a second thermoplastic elastomer thin film to be employed in the present invention.
Figure 18B:
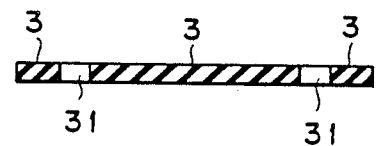
FIG. 18B is a sectional view taken along line C-C' of FIG. 18A.

FIGS. 18A and 18B show an embodiment of a second plastic thin film, for example, a thermoplastic elastic thin film such as a thermoplastic rubber film, which acts as a thickness compensating spacer and an insulator layer for insulating a bottom surface of the IC chip 10 when the second plastic thin film is stacked with the film carrier 1 and the first thermoplastic elastic thin film 2.

In this embodiment, reference numeral 3 denotes the second thermoplastic elastic thin film; and 31 aligning apertures formed in this thin film 3. In FIGS. 19A and 19B and FIGS. 20A, 20B and 20C, there is shown an embodiment of a jig for stacking and compressing the film carrier 1 carrying the IC chip, the first thermoplastic elastic thin film 2 and the second thermoplastic elastic thin film 3 as described above.

Figure 19A:
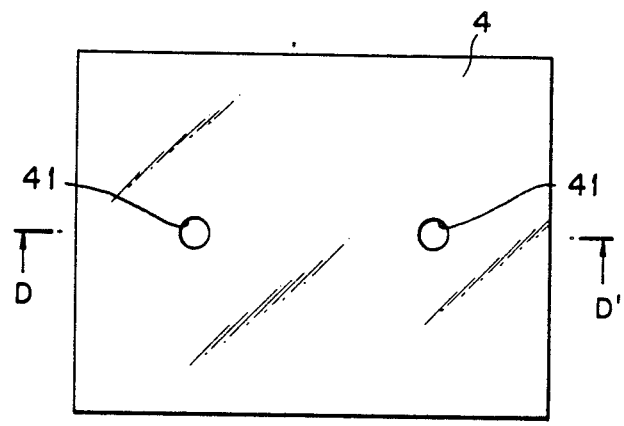
FIG. 19A is a plan view showing an embodiment of one of the jigs to be employed in the present invention.
Figure 19B:
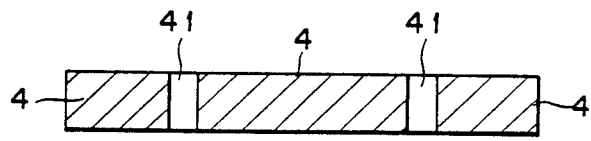
FIG. 19B is a sectional view taken along line D-D' of FIG. 19A.

FIGS. 19A and 19B show a top portion jig, wherein, reference numeral 4 denotes a top plate as the jig. Aligning apertures 41 are provided in the top plate 4. FIGS. 20A, 20B and 20C show a base portion jig. Here, reference numeral 5 denotes a base plate of the base portion of the jig. Rods 51 project from the base 5, and projections 52 are disposed at opposite end portions of one of the two pairs of opposite ends of the base 5. The apertures 41 of the top jig 4 are is slightly larger in diameter than the rods 51 of the base jig 5 so that the rods 51 are rod 51 is inserted into the apertures 41.

Next, with reference to FIG. 21, explanation will be made of a process for forming an elementary unit by stacking the film carrier 1 carrying the IC chip, the first thermoplastic elastic thin film 2 and the second thermoplastic elastic thin film 3 with using the jigs 4 and 5.

Figure 21:
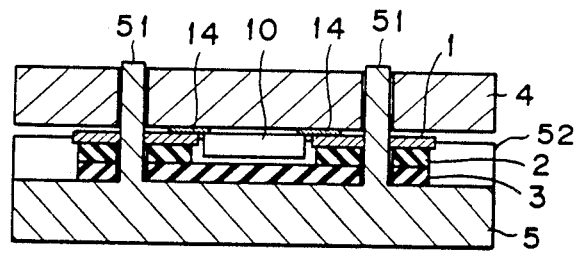
FIG. 21 is a sectional view illustrating a process for forming a laminated structure of elementary units in the present invention.

FIG. 21 shows a condition in which these members 3, 2 and 1 are stacked while the rod 51 of the base jig 5 is inserted into their aligning apertures 31, 21 and 12 in this order, respectively, so that these apertures 12, 21 and 31 are aligned with each other and the rod 51 is further inserted into the aperture 41 of the top jig 4. In this condition, the height of the projection 52 of the base jig 5 is so set that the height is slightly lower than the entire thickness of the thus stacked film carrier 1 and the first and the second thermoplastic elastic thin films 2 and 3 (hereinafter referred to as "total thickness"), so that the thus stacked members 1, 2 and 3 can be compressed to the height of the projection 52 as described later.

After forming the structure shown in FIG. 21 in this manner, the entire structure is heated, while applying a pressure between the jigs 4 and 5, so that the first and the second thermoplastic elastic thin films 2 and 3 are deformed under the pressure to reduce the total thickness corresponding to the height of the projection 52 by decreasing the thicknesses of the films 2 and 3.

Figure 22:
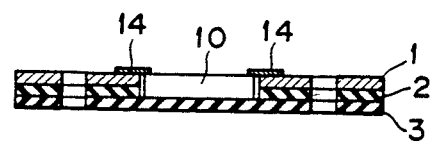
FIG. 22 is a sectional view showing a chip carrying structure as an elementary unit formed according to the present invention.

After this compression step, the thus compressed structure is cooled to room temperature as a whole, and then the jigs 4 and 5 are removed from the cooled structure, so that an IC carrying structure having the total height equal to that of the projection 52 is obtained as an elementary unit for stacking IC chips, as shown in FIG. 22. In this embodiment, it is possible to compensate the total thickness of the structure by the elastic thin films 2 and 3. The total thickness of 850 μm was obtained when the thicknesses of the elastic thin films 2 and 3 were 500 μm and 300 μm, respectively.

Figure 23:
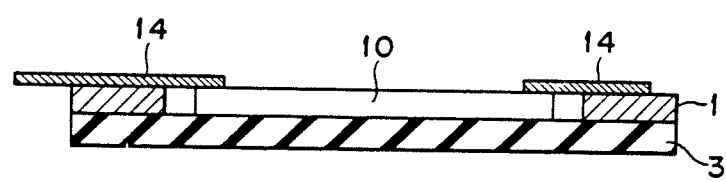
FIGS. 23 and 24 are sectional views showing two other embodiments of the elementary unit according to the present invention.

Incidentally, in case the thickness of the IC chip 10 is substantially equal to that of the film carrier 1 as shown in FIG. 23, it is possible to eliminate the first thermoplastic elastic thin film 2 of the embodiment described above.

Figure 24:
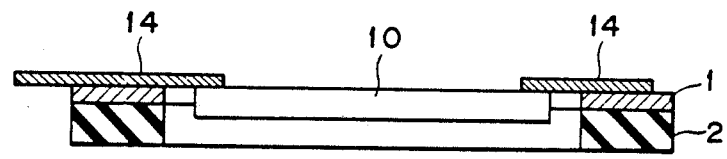

In case that it is sufficient to fix the IC chip 10 only by the leads 13 and 14 disposed on the film carrier 1, and that the rear surface of the IC chip 10 is sufficiently insulated only by a spatial insulation, only the first thermoplastic elastic thin film 2 having a thickness sufficiently larger than that of the IC chip 10 can be used, while the second thermoplastic elastic thin film 3 can be eliminated, as shown in FIG. 24.

Further, notches can be provided in place of the above-described various apertures 12, 21 and 31. In short, any type of aligning openings can be used as far as the aligning rod can be inserted.

In the above-described IC carrying structure shown in FIG. 23 or 24, while the total thickness of the structure can be made substantially equal to 0.8 mm which is substantially equal to the thickness (about 0.5 mm) of the IC chip 10, it is further possible to reduce the total thickness of the structure to approximately 0.5 mm by further reducing the thickness of the IC chip.

Further, the above described plastic thin films 2 and 3 are made of insulating material which is deformable under heat and pressure, and is not necessarily elastic material, but it is required that the films 2 and 3 can be well bonded to the film carrier 1, while the films 2 and 3 can be easily separated from the compression jigs 4 and 5 after the films 2 and 3 are compressed. For example, thermoplastic elastic material such as polyolefin series elastomer is preferable as the material of films 2 and 3. However, the material of the films 2 and 3 is not limited to this material only.

Figure 25:
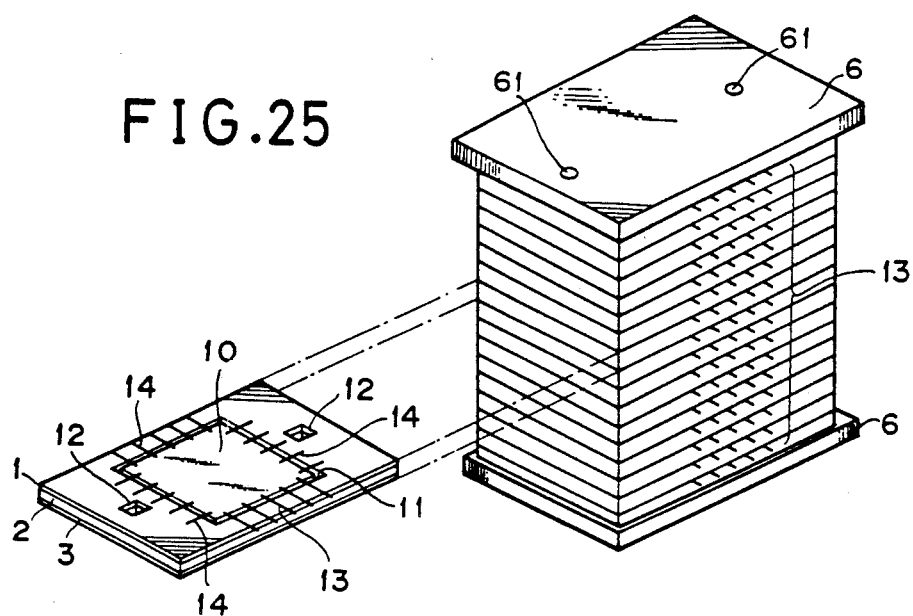
FIG. 25 is a perspective view showing a laminated condition of the elementary units.
Figure 26:
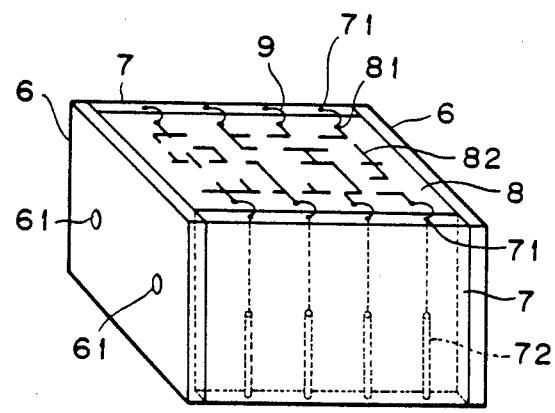
FIG. 26 is a perspective view showing an embodiment of a three-dimensional packaging structure thus laminated and obtained.
Figure 27:
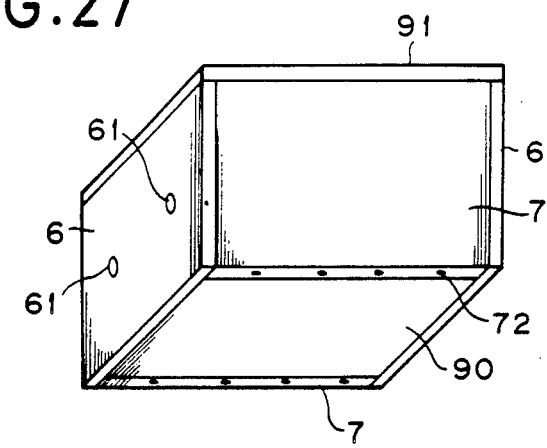
FIG. 27 is a perspective view showing an embodiment of a three-dimensional packaging structure after it is packaged.

FIGS. 25–27 show an embodiment of a structure in which the thus obtained IC chip carrying structures are stacked and interconnected in wiring in a three-dimensional manner.

In FIGS. 25 to 27, reference numeral 6 denotes an end portion fixing plate; 61, an aligning rod attached to the plate 6; 7, a side portion fixing plate; 71, a bonding pad provided in a side surface of the side portion fixing plate 7; 72, a socket for external connection, which is embedded in the side portion fixing plate 7; 8, an insulating layer arranged in the stacking direction of the elementary units (i.e., the layer 8 is arranged along a plane perpendicular to a main surface of the film carrier 1); 81, a bonding pad provided on a surface of the insulating layer 8; 82, a wiring layer prepared on a surface of the insulating layer 8 by photolithography and mask-deposition evaporation; and 9, a bonding wire for connecting the bonding pads 71 and 81 to each other.

In order to obtain this structure, first, the IC chip carrying structures are so stacked as shown in FIG. 25 that the external connection leads 13 of the film carrier 1 are disposed in the stacking direction of the elementary units, i.e., in a plane perpendicular to the main surface of the film carrier 1, or on a side of the insulator layer 8, by inserting the aligning rods 61 into the aligning apertures 12, 21 and 31 of the film carrier 1, and the thin films 2 and 3, respectively. The opposite ends of the laminated strucuture are fixed by the end portion fixing plates 6.

As a result of stacking 16 elementary units, a lead alignment accuracy of ±20 μm was obtained by means of the aligning aperture of the film carrier 1, and a stacking pitch accuracy of ±30 μm was obtained.

Further, as shown in FIG. 26, the side portion fixing plates 7 are fixed to the end portion fixing plates 6 to form a recess portion surrounded by the end portion fixing plates 6 and the side portion fixing plates 7. In the recess portion an insulator such as polyimide resin is poured so as to bury the external connection leads 13. After the insulator is hardened, the insulator is subjected to abrasion machining together with the leads 13, so that a flat insulator layer 8 is obtained in such a way that the layer 8 is co-planar with the end surfaces of the leads 13.

Further, in case the insulator layer 8 is required to be harder than resin, such harder insulator layer 8 can be formed of an inorganic film such as silicon oxide formed by a CVD method or a vacuum deposition method. Alternatively, the hard insulator layer 8 can be formed by pouring a fluid material containing silicon oxide and then baking to harden the material.

Subsequently, the wiring layer 82 and the bonding pad 81 for the connections of the end surfaces of the leads 13 are formed on the insulator layer 8 by photolithography and etching.

On the other hand, the socket 72 for external connections of the side portion fixing plate 7 is connected to the bonding pad 81 by connecting the bonding pads 71 and 81 to each other through the bonding wires 9. As a result, electric connections between the stacked IC chips and the sockets 72 for the external connections are entirely completed.

FIG. 27 shows the appearance of an embodiment of a completed three-dimensional packaging structure provided with a cover for protecting the inside and fitted to the thus obtained wiring connection structure as described above.

In FIG. 27, reference numeral 90 denotes a bottom plate; and 91 an upper plate. Exposed surfaces of the three-dimensional packaging structure, i.e., the surfaces of the insulator layer 8 and the surface opposite to the layer 8 are covered by these covering members 90 and 91. Further, the upper plate 91 is provided with a space in its inside so as not to damage the bonding pads 71 and 81 and the bonding wire 9 when the plate 91 is mounted.

In the above structure, it is possible to realize a solid state memory of 2M bytes in a form of a device having a thickness of only about 40 mm by stacking, for example 64 memory chips of 256K bits. This means that a file memory unit, which is usually arranged by a recording medium such as a magnetic disc or a magnetic tape, can be formed by a solid state memory.

As described above, in the present invention, the thickness of the stacked elementary units is determined with a high accuracy by stacking the film carrier and the thermoplastic elastic thin film and then heating and compressing the stacked structure, so that the leads can be aligned with high accuracy when stacking. However, when the number of the elementary units to be stacked increases, or a high density stacking is conducted, an accumulation of errors, each due to one elementary unit sometimes becomes serious. If it is assumed that the thickness of the elementary unit for the stacked structure is d; an error in the thickness d is $\Delta d$ and the thickness of the stacked structure constructed of n elementary units is $nd \pm n\Delta d$. If an error of $\pm n\Delta d$ is not allowed, it is possible to eliminate the accumulated error ($\pm n\Delta d$) by using an elastic effect of the thermoplastic elastic material as follows. First, when the elementary unit is prepared, the thickness of the elementary unit is determined to be larger than its final thickness d by its maximum error $\Delta d_{max}$ which is previously estimated, so that the thickness of the elementary unit is determined to be $(d+\Delta d_{max})\pm\Delta d$.

When n elementary units are stacked to form a stacked structure, and then the stacked structure is fixed at its opposite ends by the fixing plates, the stacked structure as a whole is slightly compressed to decrease its thickness to the extent that the distance between the fixing plates is equal to nd, by using the elastic effect of the thermoplastic elastic material of the elementary unit for the laminated structure. According to the above structure, it is possible to make the total thickness of the laminated structure equal to nd, when the structure has n elementary units, since each of the elementary units reduces its thickness by an amount of 0 to 2 $\Delta d_{max}$. As a consequence, the accumulated error caused by this stacking is eliminated and thus a precise alignment of the leads is realized.

Next, an embodiment of the present invention, which is so constructed to allow heat dissipation from the chips in the IC chip carrying structure described above, will be described.

Figure 28A:
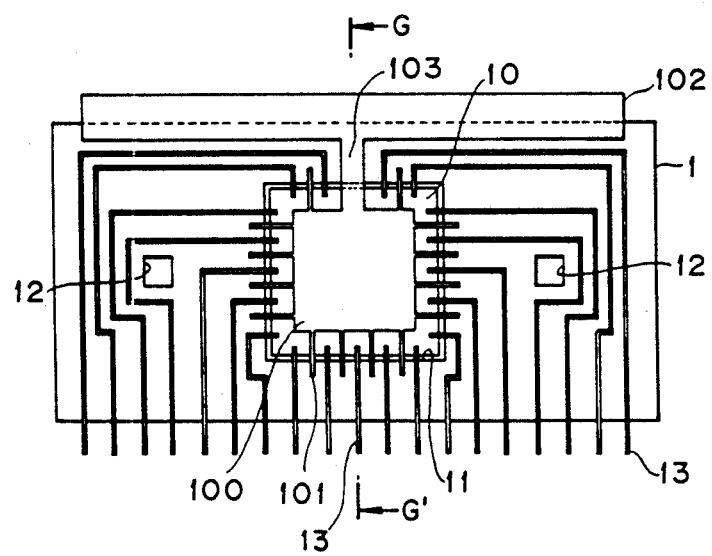
FIG. 28A is a plan view showing an embodiment of the elementary unit provided with a heat radiator structure according to the present invention.
Figure 28B:
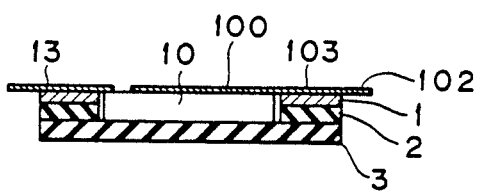
FIG. 28B is a sectional view taken along line G-G' of FIG. 28A.

FIGS. 28A and 28B show an embodiment of the present invention applied to a case in which bumps for external connections are provided along the four sides of the IC chip like a memory chip, so that the external connection leads 13 are connected to the bumps along these four sides. On the film carrier 1 of this embodiment, the pattern of the external connection leads 13 is formed from a copper foil, and at the same time a thermal conductive portion 100 having, for example, a substantially square shape and having an area which is smaller than that of the chip 10; legs 101 projecting from each side of the thermal conductive portion 100 so as to support this thermal conductive portion 100 in the device opening 11; a radiator portion 102 extending over the edge portion of the film carrier 1; and a thermal conductive portion 103 for connecting the thermal conductive portion 100 to the radiator portion 102, at positions corresponding to the position of the device opening 11 in which the chip 10 is disposed are also formed from the same copper foil. Namely, after the formations of the device opening 11 and the aperture 12 in the film carrier 1, the film carrier 1 is coated with the copper foil in which the patterns for the leads 13 and the above portions 100, 101, 102 and 103 are formed.

Figure 29:
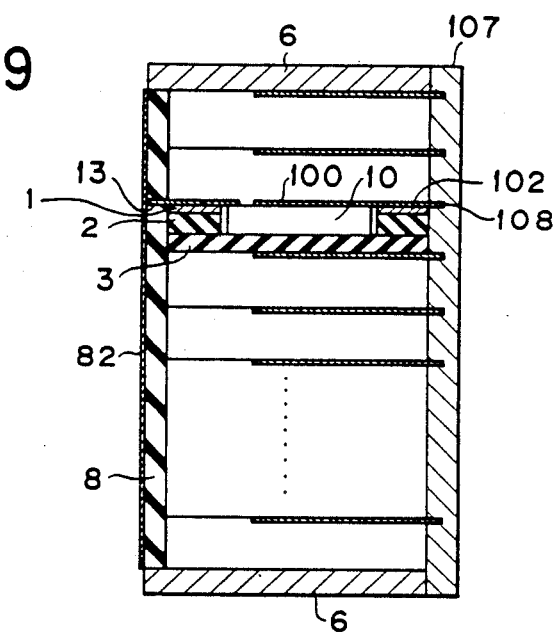
FIG. 29 is a sectional view showing an embodiment of a three-dimensional packaging structure having a heat dissipating structure in accordance with the present invention.

The IC chip 10 and the leads 13 of the film carrier 1 can be connected to each other by the inner-lead bonding method as described above. The IC chip 10 can be connected to the thermal conductive portion 100 by connecting the bumps, which are further added to the IC chip 10, to the copper foil of the thermal conductive portion 100 by thermocompression bonding according to the inner-lead bonding method or by a bond having a high thermal conductivity. Further, the IC chip 10 is pressed against the thermal conductive portion 100 in a stacked condition thereof, so that heat conduction is accomplished without the above described connections. Then, by using the above described jigs 4 and 5, the film carrier 1 having the patterned copper foil patterned for use as a radiator as shown in FIG. 28A is integrated with the thermoplastic elastic thin films 2 and 3 to form the IC chip carrying structure as shown in FIG. 28B. The IC chip carrying structures are stacked as shown in FIG. 25, and then fixed by the end portion fixing plates 6 and side portion fixing plates 107 made of metal with a high thermal conductivity as shown in FIG. 29. This side portion fixing plate 107 is provided with a narrow groove 108 with which the above described radiator portion 102 is engaged. The plate 107 serves as a radiator plate for dissipating heat, which is received from the radiator portion 102, outside the IC chip carrying structure.

Figure 30:
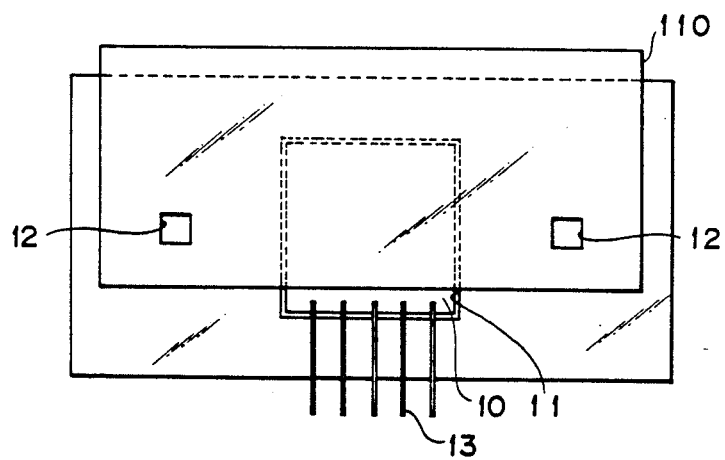
FIG. 30 is a plan view showing another embodiment of the film carrier which radiates heat.

FIG. 30 shows a cooling structure when the external connection leads 13 are connected only to one side of the IC chip 10 as shown in FIG. 16A. In this embodiment, the device opening 11 and the aligning apertures 12 are first opened in the film carrier 1, and thereafter, the leads 13 and the radiator pattern 110 are formed from copper foil. The pattern covers the majority of the IC chip 10 and the device opening 11 and extends over the edge portion of the film carrier 1.

Further, of the pattern 110, portions corresponding to the apertures 12 may be aperture patterns.

Figure 31:
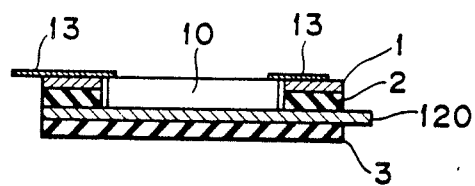
FIG. 31 is a sectional view showing a further embodiment of a heat dissipating structure in the present invention.

FIG. 31 shows an embodiment of a radiator structure made of a metal plate. In this embodiment, a plate 120 functioning as a radiator is interposed between the first and the second thermoplastic elastic thin films 2 and 3.

Figure 32:
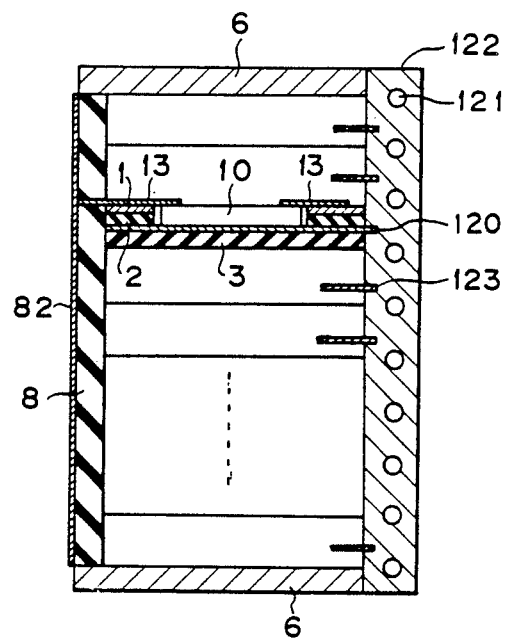
FIG. 32 is a sectional view showing an embodiment of a three-dimensional packaging structure in accordance with the present invention, in which the heat dissipating structure shown in FIG. 31 is employed.

The IC chip carrying structures, which are constructed as shown in FIG. 31, are stacked as shown in FIG. 32, and then fixed by the end portion fixing plates 6 and the side portion fixing plates 122 having a passage 121 for a coolant. This side portion fixing plate 122 is made of a material having a high thermal conductivity. The plate 122 has a narrow groove 123 which engages the end portion of the above described radiator plate 120, so that heat-exchange is performed with the coolant which receives heat from the metal plate 120 and flows through the passage 121.

As described above, according to this embodiment, in a semiconductor device chip carrying construction, an expensive chip carrying body such as a ceramic body prepared by fine workings is not required, and a chip carrying structure having a constant thickness is constructed by heating and compressing the laminated structure of the film carrier and the thermoplastic elastic thin films. Thus, it is easy to align the terminal ends of the leads for inputting/outputting electric signals in the structure in which the elementary units are stacked. As a result, wiring connections are made to provide a three-dimensional semiconductor device packaging structure inexpensively and reliably with a high accuracy.

In addition to the above, according to the present invention, since it is possible to dissipate heat generated in the semiconductor device chips to the outside of the three-dimensional packaging structure, there is no fear that the temperature of the semiconductor device chips will increase, even if the height of the packaging structure increases according to the thickness of the chip.

The spacer made of a plastic thin film used in the present invention is employed for insulating the semiconductor device chips from each other and for compensating the thickness of the semiconductor device chip, so that the thickness of the spacer can be sufficiently reduced relative to that of the chip. Consequently, it is possible that the stacking pitch of the elementary units is slightly larger than the thickness of the chip, and accordingly a high density packaging of the chips can be realized.

Furthermore, when the laminated structure is formed, a special alignment of the elementary units is not required, but a mere mechanical alignment thereof is sufficient, so that it is possible to realize an automatic mass production of the structure.

Further, in case the plastic insulating material is an elastic material, it is possible to adjust the total thickness of the laminated structure to a predetermined thickness by applying pressure to the such laminated structure in which the elementary units are stacked, in its thickness direction and fixing the structure, even if the thickness of the elementary units vary.

Furthermore, the wiring connections of the laminated structure can be made collectively, and a low cost material which does not require a special fine working can be employed, so that it is possible to conduct packaging of the chips at a low cost. Especially, when a large number of the chips are packaged, such packaging cost per chip remarkably decreases.

POSSIBLE APPLICATIONS IN THE INDUSTRY

A three-dimensional LSI packaging structure is obtained by stacking chip carrying members which carry chips and fixing the thus stacked members, so that electrodes (leads) can be aligned easily without applying any special working to the chips. Accordingly, it is easy to collectively make electric connections between the wiring plate and the leads in the laminated structure, so that the process of manufacturing the structure is efficient.

In the present invention, since there is no need of applying a special working to the chip itself, it is possible to employ a conventional chip without any modification. In addition, stacking alignment is conducted through aligning apertures provided in the chip carrying members and the fixing plates, so that it is possible to conduct a reliable alignment with a high accuracy. Furthermore, in the structure obtained according to the present invention, the thickness of the structure can be reduced in its stacking direction, so that packaging density of the structure can be increased.

When the chip is mounted on the film carrier, it is possible to employ the film carrier carrying the chips, and thus there is no need to handle the LSI chip in its bare condition, so that the LSI chip can be handled easily without damaging the chip.

When a chip carrying structure having a constant thickness is made by heating and compressing the laminated structure formed of the film carrier and the thermoplastic elastic thin films is prepared according to the present invention, the thickness of the chip carrying structure is fixed at a constant value with a high accuracy. As a consequence, by stacking the chip carrying structures as elementary units and by projecting the external connection leads from the stacking direction of the elementary units of the laminated structure, i.e., from a plane perpendicular to the main surface of the film carrier 1, the leads can be derived from the plane perpendicular to the main surface of the film carrier 1 with a high accuracy. As a result, it is possible to provide a three-dimensional semiconductor device packaging structure with a high accuracy at low cost and in a reliable manner, by forming an insulator layer on the plane to dispose a wiring pattern on the insulator layer.

In addition to the above, according to the present invention, it is possible to dissipate heat, which is generated in the semiconductor device chip, to the outside of the three-dimensional packaging structure, so that there is no fear that the temperature of the semiconductor device chip will increase, even if the packaging density of the structure is increased according to a thickness of the chip.

In the present invention, when the space between the leads of the stacked chip is filled with an insulating material, and after the surfaces of the insulating material and the leads are exposed in the stacking direction of the elementary units, i.e., in the plane perpendicular to the main surface of the film carrier 1, a metal wiring pattern is formed on the exposed surface, there is no fear that the leads are bent in their connection process, since the leads are surrounded by the insulating material, and hence reliability in connection is enhanced.

Since the connections between the leads and the wiring metal are not conducted by heating of the solder bumps or the like, but by directly connecting the wiring metal to the free end surface of the leads reinforced by the insulating material, in such a way that the wiring metal is deposited on the insulating material, the thus prepared connections have a high reliability. Since the alignment between the leads and the wiring metal is conducted by an alignment of the wiring metal in a photolithographic process, or by alignment of a mask to be used for deposition of the wiring metal i.e., by optical alignment on the wiring metal side, there is no need for a highly graded alignment apparatus or of fine workings to be applied to the chip carrying member and so on, in order to accomplish a high accuracy alignment. Accordingly, it is easy to form high density wiring.

As described above, according to the present invention, a large number of semiconductor device chips can be contained in a single package to realize a low cost and high density packaging, and therefore, for example, a Megabytes order memory device can be contained in a package having a thickness of only about 40 mm. Consequently, it is possible to replace various kinds of memory devices employing memory media such as magnetic disc or magnetic tape by this solid state memory. Furthermore, a computer hitherto mounted on a plate can be arranged in one package by containing RAMs, ROMs, CPUs and peripheral IC chips in a single package in a composite form.

We claim:

1. An elementary unit for a three-dimensional packaging structure for semiconductor device chips, comprising:
   a semiconductor device chip;
   a chip carrying member having a first surface and a second surface substantially parallel to each other, a device opening with which said semiconductor device chip is loosely engaged and at least one aperture for receiving an aligning rod, said chip carrying member having leads disposed on said first surface for holding said semiconductor device chip to said carrying member; and
   a plastic insulating material layer having at least one aperture which is aligned with a corresponding aperture of said chip carrying member, said plastic insulating material layer being fixed to the second surface of said chip carrying member.

2. An elementary unit as in claimed in claim 1, further comprising a thermal conductive layer which contacts said semiconductor device chip and extends outward from said chip carrying member.

3. An elementary unit as claimed in claim 1, wherein said plastic insulating material layer comprises:
   a first plastic insulating material layer having an opening with which said semiconductor device chip is loosely engaged, said first plastic insulating material layer being fixed to said second surface of said chip carrying member; and
   a second plastic insulating material layer adjacent to said first plastic insulating material layer.

4. An elementary unit as claimed in claim 1, wherein said plastic insulating material layer has an opening with which said semiconductor device chip is loosely engaged.

5. An elementary unit as claimed in claim 2, wherein said thermal conductive layer is disposed on said first surface of said chip carrying member.

6. An elementary unit as claimed in claim 3, further comprising a thermal conductive layer interposed between said first and second plastic insulating layers, said thermal layer being in contact with said semiconductor device chip and extending outwards from said chip carrying member.

7. An elementary unit as claimed in claim 1, wherein said chip carrying member is a film carrier.

8. A three-dimensional packaging structure for semiconductor device chips, comprising:
 a laminated structure in which a plurality of chip carrying members are stacked on top of one another, each said carrying member having a first surface and a second surface substantially parallel to each other, a device opening with which a semiconductor device chip is loosely engaged and at least one aperture for receiving an aligning rod, each said chip carrying member being in the form of a thin film and having leads disposed on the first surface thereof, said leads being in an electrically insulated condition and being connected to said semiconductor device chip to hold said semiconductor device chip, said leads comprising external connection leads which extend from at least one side of said laminated structure, said external connection leads extending perpendicular to the lamination direction of said laminated structure;
 an aligning rod inserted through said apertures to align said laminated structure;
 a wiring member having an electrically conductive pattern which is electrically connected to said external connection leads.

9. A three-dimensional packaging structure bar semiconductor device chips as claimed in claim 8, wherein said wiring member is a wiring board provided with said electrically conductive pattern and bumps disposed on said electrically conductive pattern connect said external connection leads to said electrically conductive pattern.

10. A three-dimensional packaging structure of semiconductor device chips as claimed in claim 8, wherein said wiring member comprises:
 an insulating layer in which said connection leads are embedded such that the free ends of said external connection leads are substantially co-planar with a surface of said insulating layer; and
 a wiring layer which is disposed on said surface of said insulating layer and is provided with said electrically conductive pattern which electrically connects said connection leads to each other.

11. A three-dimensional packaging structure of semiconductor device chips as claimed in claim 8, further comprising a plurality of elementary units, each said elementary unit comprising one said chip carrying member, an attached semiconductor device chip and an attached plastic insulating material layer, wherein said chip carrying member and said plastic insulating material layer are alternately disposed.

12. A three-dimensional packaging structure for semiconductor device chips as claimed in claim 11, wherein each said elementary unit further comprises a thermal conductive layer fixed to said carrier member which contacts the semiconductor device chip attached to said chip carrying member and extends outward from said chip carrying member, said chip carrying members, said plastic insulating material layer and said thermal conductive layer being stacked to receive the aligning rod inserted into said apertures to form a laminated structure; and wherein said three dimensional packaging structure further comprises
 a radiator board to which said thermal conductive layers are attached which is parallel to a side of said laminated structure from which said thermal conductive layers extend.

13. A three-dimensional packaging structure of semiconductor device chips as claimed in claim 9, further comprising an intermediate board parallel to said wiring board and disposed between said chip carrying members and said wiring board having holes disposed at positions corresponding to said external connection leads, said external connection leads being vertically embedded in bumps on said wiring board.

14. A three-dimensional packaging structure of semiconductor device chips as claimed in claim 9, wherein the free end portions of said external connection leads are collectively bent to form bent portions in the same plane and said bent portions are connected to bumps on said wiring board.

15. A three-dimensional structure for semiconductor device chips as claimed in claim 11, wherein said chip carrying member is a film carrier, and a fixing board is disposed on each of the two parallel end surfaces of said laminated structure, so that said laminated structure is fixed.

16. A three-dimensional structure for semiconductor device chips as claimed in claim 12, wherein said chip carrying member is a film carrier, and a fixing board is disposed on each of the two parallel end surfaces of said laminated structure, so that said laminated structure is fixed.

17. A method for manufacturing an elementary unit of a three-dimensional packaging structure for semiconductor device chips, comprising the steps of:
 forming a device opening with which a semiconductor device chip is loosely engaged and at least one aperture in a film carrier having a first and second surface substantially parallel to each other;
 coating the first surface of said film carrier with a thin metal film;
 forming leads and a wiring pattern, said leads extending from said metal film into said device opening to connect said chip to said carrier, and said wiring pattern being integrally connected to said leads and extending outwards from at least one of the sides of said film carrier;
 overlaying a plastic insulating material layer on the second surface of said carrier, said plastic layer having an aperture aligned with a corresponding said film carrier; and
 heating and compressing said film carrier and said plastic insulating material layer thus overlaid to form a laminated elementary unit having a predetermined thickness.

18. A method for manufacturing an elementary unit of a three-dimensional packaging structure for semiconductor device chips as claimed in claim 17, wherein a thermal conductive portion for heat dissipation is formed from said metal film in addition to said leads and said wiring pattern, said portion protruding into said device opening and extending outwards from at least one of the sides of said film carrier.

19. A method for manufacturing an elementary unit of a three-dimensional packaging structure for semiconductor device chips as claimed in claim 18 wherein said first thermal plastic layer has a opening which loosely engages said chip and said method further comprises after forming said leads, said writing pattern and said portion for heat dissipation, the steps of:

overlaying on said first plastic insulating material layer a thermal conductive layer having an aperture aligned with a corresponding aperture of said first plastic layer, and overlaying a second plastic insulating material layer on said thermal conductive layer, said second plastic layer having an aperture aligned with a corresponding aperture of said thermal conductive layer in such a way that the apertures of said film carrier, said first plastic insulating material layer, said thermal conductive layer and said second plastic insulating material layer are aligned with each other; and heating and compressing said film carrier, said first plastic insulating material layer, said thermal conductive layer and said second plastic insulating material layer thus overlaid to form a laminated elementary unit having a predetermined thickness.

20. A method for manufacturing a three-dimensional packaging structure for semiconductor device chips, comprising the steps of:

forming a recess and an aperture in each of a plurality of chip carrying members, each recess having a semiconductor device chip mounted therein, said chip having a plurality of leads on one side, said recess having such a depth that when said semiconductor device chip is mounted therein the upper surface of said semiconductor device chip is placed in a position slightly lower than that of an upper surface of said chip carrying member, each of said grooves having an electrically insulated surface for guiding each of said leads of said semiconductor device chip to a side of said chip carrying member, and each of said apertures serving as an aligning guide in a laminating procedure;

bonding and fitting said semiconductor device chip to each of said chip carrying members thus formed, to guide said leads of said semiconductor device chip to a side surface of said carrying member along said grooves;

stacking a plurality of said chip carrying members carrying said chips on top of one another, and fixing said chip carrying members thus stacked through said apertures;

providing a wiring board having a plurality of bumps thereon, said wiring board being substantially parallel to a side of said laminated structure from which said connection leads extend; and connecting the end of each said lead of each of said semiconductor device chip to one of the plurality of bumps on said wiring board.

21. A method for manufacturing a three-dimensional structure for semiconductor device chips comprising the steps of:

forming a device opening with which a semiconductor device chip is loosely engaged, and at least one aperture in a film carrier having a first and second surface substantially parallel to each other;

coating the first surface of said film carrier with a thin metal film;

forming leads and a wiring pattern, said leads extending from said metal film into said device opening to connect said chip to said carrier, and said wiring pattern being integrally connected to said leads and having external connection leads extending outwards from at least one of the sides of said film carrier;

overlaying a plastic insulating material layer having an aligning aperture aligned with a corresponding aperture on said film carrier;

heating and compressing said film carrier and said plastic insulating material layer thus overlaid to form an elementary unit having a predetermined thickness; and stacking a plurality of said elementary units to form a laminated structure;

inserting an aligning rod to align said plurality of elementary units with each other, wherein said film carrier and said plastic insulating material layer being alternately disposed, and said external connection leads extend from at least one of the sides of the laminated structure in a direction perpendicular to the laminating direction of said laminated structure.

22. A method for manufacturing a three-dimensional packaging structure for semiconductor device chips as claimed in claim 21, further comprising the steps of:

forming a thermal conductive portion for heat dissipation in addition to said leads and said wiring pattern, said portion protruding into said device opening and extending outwards from at least one of the sides of said film carrier; and covering a side of said laminated structure, from which said thermal conductive portion projects, with a heat dissipating plate which contacts said thermal conductive layer.

23. A method for manufacturing a three-dimensional packaging structure for semiconductor device chips as claimed in claim 21, further comprising the steps of:

overlaying on said second surface of said film carrier a first plastic insulating material layer having an aligning aperture and an opening into which said semiconductor device chip protrudes;

overlaying a thermal conductive layer having an aligning aperture on said first plastic insulating material layer; and overlaying a second plastic insulating material layer having an aligning aperture on said thermal conductive layer, said layers being overlayed in such a way that the respective aligning apertures of said film carrier, said first plastic insulating material layer, said thermal conductive layer, and said plastic insulating material layer are aligned with each other;

heating and compressing said film carrier, said first plastic insulating material layer, said thermal conductive layer and said second plastic insulating material layer thus overlaid to for an elementary unit having a predetermined thickness;

stacking a plurality of the so formed elementary units to form a laminated structure in such a way that said film corrier and said second plastic insulating material layer are alternately disposed; and covering a side of said laminated structure from which said thermal conductive layer projects, with heat dissipating plate which contacts said thermal conductive layer.

24. A method for manufacturing a three-dimensional packaging structure of semiconductor device chips, comprising the steps of:
stacking film carriers, eachof which carries a semiconductor device chip and leads which are connected to said semiconductor device chip and extend from said film carrier;
fixing the thus stacked structure;
adhering an insulating material layer to a surface of said stacked structure, on which said leads which extend from the fixed stacked structure are arranged;
planarizing a surface of said insulating material layer thus adhered; and
forming a metal layer on the thus planarized surface, said metal layer having an electrically conductive pattern to be connected to said leads.

25. An elementary unit as claimed in claim 2, wherein said plastic insulating material layer comprises:
a first plastic insulating material layer having an opening with which said semiconductor device chip is loosely engaged and, said first plastic insulating material layer being fixed to said second surface of said chip carrying member; and
a second plastic insulating material layer fixed to said first plastic insulating material layer.

26. A method for manufacturing a three-dimensional packaging structure of semiconductor device chips, comprising the steps of:
stacking film carriers, each of which carries a semiconductor device chip and leads which are connected to said semiconductor device chip and extend from said film carrier;
fixing the stacked structure; and
connecting each end of said leads projecting from the stacked structure thus fixed to each of bumps of a wiring board which is arranged substantially perpendicularly to said semiconductor device chip.

27. A carrier unit for a three-dimensional packaging structure for semiconductor device chips, comprising:
a chip carrying member having a first surface and a second surface substantially parallel to each other, a device opening for loosely engaging a semiconductor device chip and at least one aperture for receiving an aligning rod, and leads disposed on said first surface for holding said semiconductor device chip to said carrying member.

28. A carrier unit as claimed in claim 27 further comprising:
a plastic insulating material layer having at least one aperture which is aligned with a corresponding aperture of said chip carrying member, said plastic insulating material layer being fixed to the second surface of said chip carrying member.

29. A packaging structure for semiconductor device chips comprising:
a plurality of semiconductor device chips, each said chip having a plurality of leads one one side;
a plurality of carrying members stacked on top of one another, each said carrying member having a first surface, a second surface substantially parallel to said first surface, a recess in said first surface for mounting one of said semiconductor device chips therein so that the upper surface of said chip is lower than the first surface of said carrying member, grooves in said first surface for receiving the leads of said chip, said grooves being electrically insulated from each other, and an aperture for for receiving an aligning rod, said plurality of carrying members being vertically stacked upon each other;
an alignment rod inserted through said apertures of said plurality of carrying members to align said stack of carrying members.

30. An elementary unit as claimed in claim 1 wherein said at least one aperture is a notch.

31. A three-dimensional packaging structure of semiconductor device chips as claimed in claim 8 wherein said at least one aperture is a notch.

32. A method for manufacturing an elementary unit for a three-dimensional packaging structure for semiconductor device chips as claimed in claim 17, wherein said at least one aperture is a notch.

33. A method for manufacturing a three-dimensional structure for semiconductor device chips as claimed in claim 20 wherein said at least one aperture is a notch.

* * * * *